(12) United States Patent
Geim et al.

(10) Patent No.: US 9,318,591 B2
(45) Date of Patent: Apr. 19, 2016

(54) TRANSISTOR DEVICE AND MATERIALS FOR MAKING

(75) Inventors: Andre Geim, Manchester (GB); Konstantin Novoselov, Manchester (GB); Roman Gorbachev, Manchester (GB); Leonid Ponomarenko, Manchester (GB); Liam Britnell, Manchester (GB)

(73) Assignee: The University of Manchester, Manchester (GB)

( * ) Notice: Subject to any disclaimer, the term of this patent is extended or adjusted under 35 U.S.C. 154(b) by 0 days.

(21) Appl. No.: 14/006,158

(22) PCT Filed: Mar. 22, 2012

(86) PCT No.: PCT/GB2012/050641
§ 371 (c)(1),
(2), (4) Date: Sep. 19, 2013

(87) PCT Pub. No.: WO2012/127244
PCT Pub. Date: Sep. 27, 2012

(65) Prior Publication Data
US 2014/0008616 A1    Jan. 9, 2014

(30) Foreign Application Priority Data

Mar. 22, 2011 (GB) .................................. 1104824.6
Nov. 18, 2011 (GB) .................................. 1119972.6
Feb. 1, 2012 (GB) .................................. 1201759.6

(51) Int. Cl.
*H01L 29/16* (2006.01)
*H01L 29/775* (2006.01)
*H01L 29/20* (2006.01)

(Continued)

(52) U.S. Cl.
CPC ........ *H01L 29/775* (2013.01); *H01L 21/02104* (2013.01); *H01L 29/06* (2013.01); *H01L 29/1606* (2013.01); *H01L 29/2003* (2013.01); *H01L 29/267* (2013.01);
(Continued)

(58) Field of Classification Search
CPC .............. H01L 29/1606; H01L 29/778; H01L 21/02527; H01L 29/0895
See application file for complete search history.

(56) References Cited

U.S. PATENT DOCUMENTS 8,227,842 B2     7/2012  Marinero et al.
8,384,122 B1 *   2/2013  Hu ..................... H01L 29/7391
                                                    257/104

(Continued)

FOREIGN PATENT DOCUMENTS

CN            101950593 A       1/2011

OTHER PUBLICATIONS

Chen, et al. "Towards Flexible All-Carbon Electronics: Flexible Organic Field-Effect Transistors and Inverter Circuits Using Solution-Processed All-Graphene Source/Drain/Gate Electrodes", Nano Res. 2010, 3(10), pp. 714-721.

(Continued)

*Primary Examiner* — Jaehwan Oh
(74) *Attorney, Agent, or Firm* — Wilmer Cutler Pickering Hale and Dorr LLP

(57) ABSTRACT

This application relates to graphene based heterostructures and transistor devices comprising graphene. The heterostructures comprise i) a first graphene layer; ii) a spacer layer and iii) a third graphene. The transistors comprise (i) an electrode, the electrode comprising a graphene layer, and (ii) an insulating barrier layer.

14 Claims, 13 Drawing Sheets

(51) Int. Cl.
*H01L 29/267* (2006.01)
*H01L 29/417* (2006.01)
*H01L 29/51* (2006.01)
*H01L 21/02* (2006.01)
*H01L 29/06* (2006.01)
*H01L 29/778* (2006.01)

(52) U.S. Cl.
CPC ......... *H01L 29/41725* (2013.01); *H01L 29/51* (2013.01); *H01L 29/778* (2013.01)

(56) References Cited

U.S. PATENT DOCUMENTS

| | | | |
|---|---|---|---|
| 2002/0014667 A1* | 2/2002 | Shin | B82Y 10/00 257/368 |
| 2007/0187694 A1 | 8/2007 | Pfeiffer | |
| 2008/0099827 A1* | 5/2008 | Kreupl | G11C 13/0004 257/324 |
| 2009/0294759 A1 | 12/2009 | Woo et al. | |
| 2010/0176495 A1 | 7/2010 | Chu et al. | |
| 2011/0017979 A1* | 1/2011 | Meric | H01L 29/1606 257/29 |
| 2011/0030879 A1 | 2/2011 | Veerasamy | |
| 2011/0045282 A1 | 2/2011 | Kelber | |
| 2011/0059599 A1 | 3/2011 | Ward et al. | |
| 2011/0073562 A1 | 3/2011 | Zettl | |
| 2011/0089403 A1* | 4/2011 | Woo | B82Y 10/00 257/29 |
| 2011/0163298 A1* | 7/2011 | Sung | G03H 1/02 257/29 |
| 2011/0175628 A1* | 7/2011 | Kohlstedt | B82Y 10/00 324/649 |
| 2011/0233513 A1 | 9/2011 | Dimitrakopoulos et al. | |
| 2013/0102084 A1 | 4/2013 | Loh et al. | |
| 2014/0166984 A1* | 6/2014 | Gunlycke | H01L 29/775 257/39 |

OTHER PUBLICATIONS

Gerbedoen, et al. "AlGaN/GaN MISHEMT with hBN as Gate Dielectric", Diamond & Related Materials 18 (2009), pp. 1039-1042.
Gorbachev, et al. "Hunting for Monolayer Boron Nitride: Optical and Raman Signatures", Small 2011, vol. 7, No. 4, pp. 465-468.
International Search Report corresponding to International Application No. PCT/GB2012/050641, dated Dec. 3, 2012, 3 pages.
Radisavljevic, et al. "Single-Layer $MoS_2$ Transistors", Nature Nanotechnology, vol. 6, Mar. 2011, pp. 147-150.
Suganuma, et al. "Fabrication of Transparent and Flexible Organic Field-Effect Transistors with Solution-Processed Graphene Source-Drain and Gate Electrodes", Applied Physics Express 4 (2011), pp. 021603-1 through 021603-3.
Tanaka, et al. Heteroepitaxial System of h-BN/Monolayer Graphene on Ni(111), Surface Review and Letters, vol. 10, No. 4 (2003), pp. 697-703.
United Kingdom Search Report issued by the United Kingdom Intellectual Property Office for Application No. GB1104824.6 mailed on Jul. 20, 2011, 4 pages.
Wilson "Graphene Production Goes Industrial", Physics Today 63 (8), 15 (2010), 3 pages.
Xu, et al. "In-plane and Tunneling Pressure Sensors Based on Graphene/Hexagonal Boron Nitride Heterostructures", Applied Physics Letters 99, (2011), pp. 133109-1 through 133109-3.

* cited by examiner

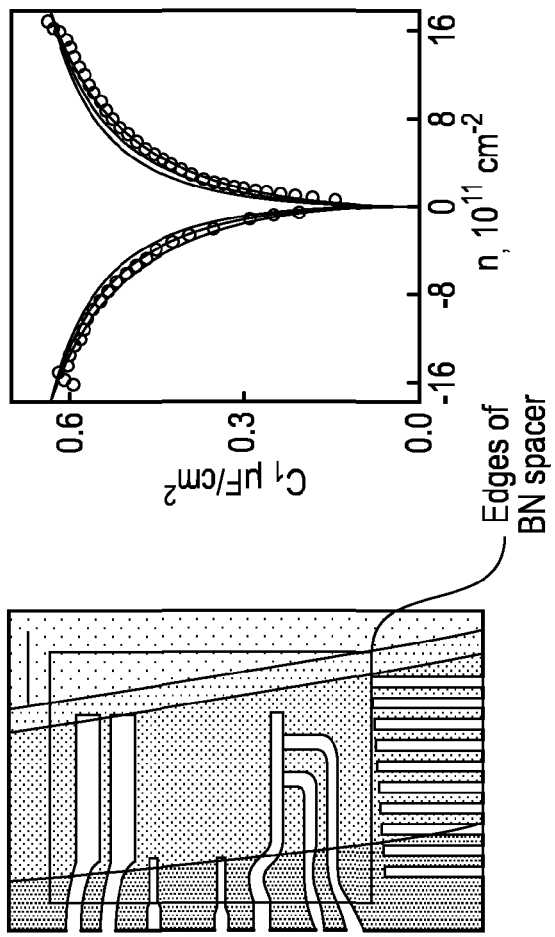
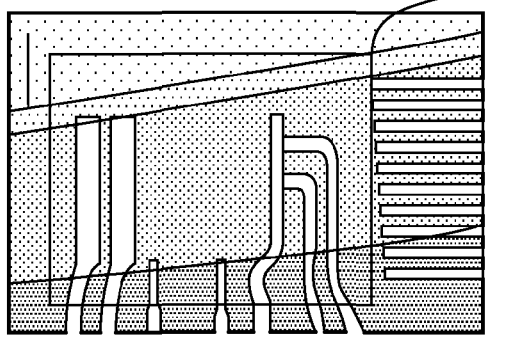
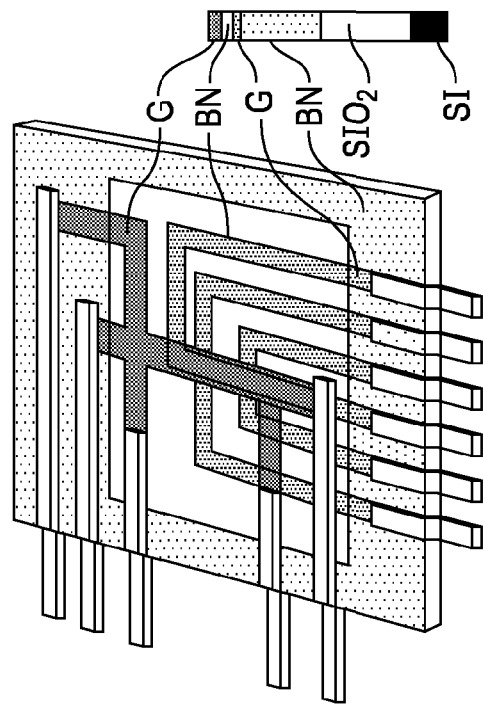
FIG. 1A
FIG. 1B
FIG. 1C

TRANSISTOR DEVICE AND MATERIALS FOR MAKING

CROSS REFERENCE TO RELATED APPLICATIONS

This application is a National Stage Entry of PCT International Application No. PCT/GB2012/050641, filed on Mar. 22, 2012, which claims priority to GB1201759.6, filed on Feb. 1, 2012, GB1119972.6, filed on Nov. 18, 2011, and GB1104824.6 filed on Mar. 22, 2011, the contents of which are incorporated herein by reference in their entirety.

This invention generally relates to transistor devices comprising an electrode, the electrode comprising a graphene layer. The invention also relates to graphene heterostructures from which said devices can be made. In particular, the present invention relates to transistors comprising (i) an electrode, the electrode comprising a graphene layer, and (ii) an insulating barrier layer. In one variant, the insulating barrier layer may comprise at least one boron nitride (BN) layer and/or at least one molybdenum disulfide layer. Thus, in some embodiments the transistors of the present invention may comprise a boron-nitride/graphene heterostructure. However, it is expected that when a transistor according to the invention is produced on a large scale it is likely that the insulating barrier will be made of a different material such as those described below.

A major challenge in research on graphene is to find innovative ways to exploit its remarkable properties. Of particular interest is the possibility of using graphene as an alternative to silicon-based electronics but the absence of an energy gap presents a severe obstacle in achieving low power dissipation in the OFF state.

The performance of graphene-based field effect transistors (FETs) has been hampered by graphene's metallic conductivity at the neutrality point (NP) and the unimpeded electron transport through potential barriers due to Klein tunneling, which limit the achievable ON-OFF switching ratios to $\sim 10^3$ and those achieved so far at room temperature to <100 (A. K. Geim, Graphene: status and prospects. *Science* 324, 1530-1534 (2009).). These low ratios are sufficient for individual high-frequency transistors and analogue electronics (Y. Wu et al., High-frequency, scaled graphene transistors on diamond-like carbon. *Nature* 472, 74-78 (2011).) but they present a fundamental problem for any realistic prospect of graphene-based integrated circuits (1-7). A possible solution is to open a band gap in graphene, for example by using bilayer graphene (E. V. Castro et al, Biased bilayer graphene: semiconductor with a gap tunable by electric field effect. *Phys. Rev. Lett.* 99, 216802 (2007).), nanoribbons, quantum dots or chemical derivatives but it has proven difficult to achieve high ON-OFF ratios without degrading graphene's electronic quality.

Accordingly, the present invention aims to provide an alternative graphene transistor architecture, namely a field-effect transistor based on quantum tunneling from a graphene electrode through a thin insulating barrier.

In the present application there is demonstrated a bipolar field-effect tunneling transistor that has the advantage of not only the high conductivity and one-atomic-layer thickness of graphene, but also the low density of states associated with its Dirac-like spectrum.

The transistors of the present invention are graphene heterostructures which, in some embodiments, incorporate atomically thin boron nitride or molybdenum disulfide as a tunnel barrier. The transistors of the present invention allow high tunnel currents >1 mA/µm² and a room-temperature ON-OFF switching ratio of $\approx 10^4$, a value that could be enhanced further by optimizing the device structure (e.g. by altering composition and thickness of the insulating barrier layer). These three-terminal tunnelling devices have potential for high frequency operation and large scale integration.

The operation of the device of the present invention relies on the voltage tunability of the tunneling density of states (DoS) in graphene and of the effective height A and shape of the tunnel barrier adjacent to the graphene electrode.

Thus, there is disclosed herein a bipolar field-effect transistor that exploits the low density of states in graphene and its one atomic layer thickness. Our devices are graphene heterostructures with atomically thin boron nitride or molybdenum disulfide, or other materials described below, acting as a vertical transport barrier. They exhibit room temperature switching ratios of $\approx 50$ and $\approx 10,000$ respectively. Such devices have potential for high frequency operation and large scale integration. There is also the possibility of "designing in" the desired switching ratio by the appropriate choice of material to be used in conjunction with the graphene.

Throughout this disclosure, reference to graphene can be understood as a one-atom-thick planar sheet of carbon atoms arranged in a honeycomb lattice. Similarly, reference to boron nitride can be understood as meaning a one-atom-thick planar sheet of boron and nitrogen atoms arranged in a honeycomb lattice. However, these materials can also be used in the form of a sheet having more than atomic layer eg. as two or more atomic layers of graphene or boron nitride. Similarly, the other materials described below such as molybdenum disulphide can be present in the form of a sheet having more than one atomic layer.

SUMMARY OF THE INVENTION

According to a first aspect, the invention provides a graphene heterostructure having:
 a first graphene layer;
 a second graphene layer; and
 a spacer layer positioned between the first graphene layer and the second graphene layer.

According to a second aspect, the present invention provides a transistor comprising:
 a source electrode;
 a drain electrode; and
 an insulating barrier in contact with and situated between both the source electrode and the drain electrode, the insulating barrier comprising from 1 to 30 layers of one or more materials;
wherein at least one of the source electrode and drain electrode comprises a layer of graphene and the other electrode comprises a layer of a conductive material.

A transistor necessarily further comprises a gate electrode; however in the case of the present invention the positioning and nature of the gate electrode is secondary. The transistors of the present invention enjoy their unique benefits on account of the positioning of the source and drain electrode relative to one another and the fact that at least one of them is formed from graphene.

In an embodiment, the source electrode and the drain electrode both comprise a layer of graphene. Thus, the transistor devices of the second aspect may comprise the heterostructures of the first aspect. In such cases it may be that the source electrode of the transistor is the first graphene layer of the heterostructure and the drain electrode of the transistor is the second graphene layer of the heterostructure. Alternatively, it may be that the source electrode of the transistor is the second graphene layer of the heterostructure and the drain electrode of the transistor is the first graphene layer of the heterostructure. The spacer layer of the heterostructure corresponds to the insulating barrier of the transistor. The terms 'spacer layer' and 'insulating barrier' as used in this specification are interchangeable.

Heterostructures

The term graphene used above includes both "pristine" i.e. chemically unmodified graphene and also functionalised graphene. The individual graphene layers forming the top and/or bottom electrode may thus be graphene or functionalised graphene. The graphene could also be modified by physical means such as heat treatment. Hereafter, for brevity, we collectively refer to both graphene and modified graphene simply as graphene.

By spacing the layers of graphene, the interactions between layers of graphene can be investigated and utilised, see Experiment 1 for details. Preferably, the carrier mobility in one or both of the graphene layers is as high as 2.5 $m^2$/Vs, 5 $m^2$/Vs or 10 $m^2$/Vs. Preferably the graphene heterostructure is such that the leak current through the spacer layer is not detectable (>1 GΩ).

Preferably, the spacer layer includes (more preferably is made from) boron-nitride. More preferably, the spacer layer includes (more preferably is made from) hexagonal boron-nitride. The spacer layer may be a hexagonal boron-nitride crystal, for example.

Hexagonal boron-nitride is preferred as a material for the spacer layer, because it can act as an atomically smooth and inert substrate for graphene. Also, hexagonal boron-nitride can be made thin, so that the layers of graphene can be positioned close together, whilst still providing an effective barrier to prevent leak currents between the layers of graphene. Positioning the layers of graphene close together produces transport properties (e.g. unusual coulomb drag properties) which can be investigated and utilised, see Experiment 1 for details. Positioning two layers of graphene close together whilst still providing an effective barrier to prevent leak currents is different from e.g. known GaAs/AlGaAs double quantum well structures, which generally need to be kept at low temperatures in order to reduce leak currents. As discussed below in more detail, materials other than hexagonal boron-nitride (e.g. aluminium oxide) can be used as the spacer layer in the present invention. The benefit of each depends on its own particular properties and some materials are more suitable than others. Thus some of the alternative materials are better than hBN and some are worse. One important feature of these materials which affects their suitability is whether or not they are able to adopt a flat structure and/or are convenient for large scale implementation.

The growth of graphene on BN, and in particular hexagonal BN, is unpredictable and difficult to achieve at present moment. The present invention has succeeded in providing for the first time BN graphene composite structures which can be produced and characterised.

In reality, for example, one of the major problems we have found when attempting to form structures relates to the fact that the deposition of graphene on hBN can result in numerous 'bubbles' containing trapped adsorbates (presumably hydrocarbons). This can seriously impact on the electrical properties of the graphene and on the heterostructure as a whole. This issue has not previously been recognised in the prior art. However, such bubbles, if present in the active part of devices, will cause significant charge inhomogeneity and effectively render the devices useless. We have overcome this and other problems when providing a graphene-based transistor with a spacer layer.

Preferably, the spacer layer lies directly next to the first graphene layer, i.e. with no layers therebetween. Preferably the second graphene layer lies directly next to the spacer layer, i.e. with no layers therebetween.

Preferably, the spacer layer has a thickness of 10 nm or less, more preferably a thickness in the range 2 to 4 nm, and may have a thickness approximately equal to 3 nm. At these thicknesses, the spacer layer (especially if the spacer layer is of hexagonal boron-nitride) is thin, whilst still being able to prevent leak currents at room temperature (if e.g. hexagonal boron-nitride is used as the material for the spacer layer). For some applications, the spacer layer may have a thickness less than 3 nm, less than 2 nm or even a thickness of only one atom thick in applications where current leakage (e.g. at room temperature) is not an issue.

The first graphene layer is preferably a single sheet of graphene, i.e. it is preferably one atom thick. The second graphene layer is preferably a single sheet of graphene, i.e. it is preferably one atom thick. However, it is also possible for the first and/or second graphene layer to include multiple sheets of graphene. For example, the first and/or second graphene layer could include two sheets of graphene (so-called "bilayer graphene") or even three sheets of graphene (so-called "trilayer graphene"). Above three sheets of graphene, it is thought that the electric properties of the graphene layer become less useful. Accordingly, the first and/or second graphene layer preferably includes no more than three sheets of graphene except for structural defects, where graphene may have a discontinuity or be more than three layer thick.

The first graphene layer and/or second graphene layer is/are preferably shaped, e.g. by removing portions of the layer (e.g. by etching, e.g. by electron-beam lithography and/or oxygen plasma etching) to form a structure. The structure may include one or more contact regions for connecting the structure to an external device. The second graphene layer may be shaped to form a structure that corresponds to that formed by the first graphene layer or may be shaped to form a different structure. The structure formed in the first and/or second graphene layer could be a hall bar structure, for example, but other structures are equally possible, e.g. the structure could simply be a single conductive track. Hall bar structures are well known, and some examples are illustrated in the Experiments described below. Hall bar structures may allow the properties of the graphene heterostructure to be investigated, see e.g. Experiment 1.

The graphene heterostructure may include one or more contacts, e.g. of metal, e.g. to connect the first and/or second graphene layer to external electronics. Each of the one or more contacts may be positioned on one or more respective contact regions included in a structure formed in the first graphene layer and/or a structure formed in the second graphene layer (see above).

Preferably, the spacer layer is aligned or has openings with respect to the first graphene layer so that it covers only a portion of the first graphene layer, preferably so that one or more contact regions included in a structure formed in the first graphene layer (see above) are not covered by the spacer layer. This allows one or more contacts to be deposited on one or more contact regions included in a structure formed in the first graphene layer and/or a structure formed in the second graphene layer after the second graphene layer has been deposited on the graphene layer, e.g. by electron beam lithography. Advantageously, contacts may be deposited on one or more contact regions included in a structure formed in the first layer of graphene and a structure formed in the second layer of graphene in a single lithography run.

The graphene heterostructure may include a base layer on which the first graphene layer is positioned. Preferably, the first graphene layer lies directly next to the base layer, i.e. with no layers therebetween. The base layer preferably includes (more preferably is of) boron-nitride. More preferably, the base layer includes (more preferably is of) hexagonal boron-nitride. The base layer may be a hexagonal boron-nitride crystal, for example. Hexagonal boron-nitride is preferred as a base layer because it is an atomically smooth and inert substrate for graphene. It is thought that materials other than hexagonal boron-nitride (e.g. aluminium oxide) could in principle be used as the base layer. However, these other materials are not preferred because they are not as flat and/or do not have other useful properties possessed by boron nitride.

The graphene heterostructure may include a substrate on which the base layer (or the first graphene layer) is positioned. Preferably, the base layer (or first graphene layer) lies directly next to the substrate, i.e. with no layers therebetween. The substrate preferably include a silicon wafer, preferably an oxidised silicon wafer, e.g. so that the substrate has $SiO_2$ insulating layer.

The first aspect of the invention may also provide a method of making a graphene heterostructure having:

a first graphene layer;
a second graphene layer; and
a spacer layer positioned between the first graphene layer and the second graphene layer.

The method may include any method step implementing or corresponding to any apparatus feature described in connection with the second aspect of the invention.

For example, the method may include:
depositing a spacer layer on a first graphene layer; and
depositing a second graphene layer on the spacer layer so that the spacer layer is positioned between the first graphene layer and the spacer layer.

As another example, the spacer layer preferably includes (more preferably is of) boron-nitride. More preferably, the spacer layer includes (more preferably is of) hexagonal boron-nitride. The spacer layer may be a hexagonal boron-nitride crystal, for example.

As another example, the spacer layer is preferably deposited so that it lies directly next to the first graphene layer. Similarly, the second graphene layer is preferably deposited so that it lies directly next to the spacer layer.

As another example, the spacer layer is preferably deposited so as to have a thickness of 10 nm or less, more preferably a thickness in the range 2 to 4 nm, and may have a thickness approximately equal to 3 nm.

As another example, the first layer of graphene layer is preferably deposited so as to be a single sheet of graphene, i.e. so that it is preferably one atom thick. The second layer of graphene layer is preferably deposited so as to be a single sheet of graphene, i.e. so that it is preferably one atom thick.

As another example, the method preferably includes shaping the first graphene layer and/or second graphene layer, e.g. by removing portions of the layer (e.g. by etching, e.g. by lithography and/or oxygen plasma etching) to form a structure. The shaping of the first graphene layer is preferably performed after the first graphene layer has been deposited, but before the spacer layer has been deposited. The shaping of the second graphene layer is preferably performed after the second graphene layer has been deposited. The structure formed in the first and/or second graphene layer could be a hall bar structure, for example, but other structures are equally possible, e.g. the structure could simply be a single conductive track. Hall bar structures are well known, and some examples are illustrated in the Experiments described below. Hall bar structures may allow the properties of the graphene heterostructure to be investigated, see e.g. Experiment 1.

As another example, the method may include depositing one or more contacts, e.g. of metal, e.g. of metal, e.g. to connect the first and/or second graphene layer to external electronics. The one or more contacts may be deposited on (i.e. so that they are positioned on) one or more contact regions included in a structure formed in the first graphene layer and/or a structure formed in the second graphene layer (see above).

As another example, the spacer layer may cover only a portion of the first graphene layer, preferably so that one or more contact regions included in a structure formed in the first graphene layer (see above) are not covered by the spacer layer. The spacer layer is preferably aligned before it is deposited on the first graphene layer, eg using an optical mask aligner.

As another example, the method may include depositing the first graphene layer on a base layer. This is preferably performed before depositing the spacer layer and depositing the second graphene layer. Preferably, the first graphene layer is deposited so that it lies directly next to the base layer. The base layer preferably includes (more preferably is of) boron-nitride. More preferably, the base layer includes (more preferably is of) hexagonal boron-nitride. The base layer may be a hexagonal boron-nitride crystal, for example.

As another example, the method may include depositing the base layer (or first graphene layer) on a substrate. This is preferably performed before depositing the spacer layer, depositing the second graphene layer, and (if applicable) depositing the first graphene layer. The base layer (or first graphene layer) is preferably deposited so that is lies directly next to the substrate. The substrate preferably include a silicon wafer, preferably an oxidised silicon wafer, e.g. so that the substrate has $SiO_2$ insulating layer.

The base layer (or first graphene layer) may be deposited on the substrate mechanically, e.g. by exfoliation (mechanical cleavage), which is a technique well understood in the art.

Although the base layer (or first graphene layer) may be deposited on the substrate by exfoliation, this technique is not so well suited for depositing the first graphene layer on the base layer, the spacer layer on the first graphene layer, or the second graphene layer on the spacer layer, where exfoliation may make it difficult to align the layers and/or cause contamination, for example.

Accordingly, the first graphene layer may be deposited on the base layer according to a method using a precursor structure, the precursor structure including the first graphene layer positioned on a carrier layer, the method including:
depositing the precursor structure on the base layer with the first graphene layer facing the base layer (and therefore the carrier layer facing away from the base layer); and
subsequently (i.e. after depositing the precursor structure on the base layer) removing the carrier layer from the first graphene layer.

Similarly, the spacer layer may be deposited on the first graphene layer according to a method using a precursor structure, the precursor structure including the spacer layer positioned on a carrier layer, the method including:
depositing the precursor structure on the first graphene layer with the spacer layer facing the first graphene layer (and therefore the carrier layer facing away from the first graphene layer); and subsequently (i.e. after depositing the precursor structure on the first graphene layer) removing the carrier layer from the spacer layer.

Similarly, the second graphene layer may be deposited on the spacer layer according to a method using a precursor structure, the precursor structure including the second graphene layer positioned on a carrier layer, the method including:

depositing the precursor structure on the spacer layer with the second graphene layer facing the spacer layer (and therefore the carrier layer facing away from the spacer layer); and subsequently (i.e. after depositing the precursor structure on the spacer layer) removing the carrier layer from the second graphene layer. The method may include any additional steps described in or associated with the third aspect of the invention.

The method preferably includes, after depositing any one or more of the layers (particularly after depositing any one or more of the first graphene layer, the spacer layer and the second graphene layer), cleaning the graphene heterostructure, e.g. by annealing, e.g. at a temperature approximately equal to 300° C. and/or in an argon-hydrogen atmosphere, e.g. so as to remove residue and/or other contamination.

Although in the experiments listed below graphene and boron nitride were mechanically exfoliated from a bulk crystal, this technique may not be well suited for a large scale implementation and is likely to be replaced by an appropriate growth method. Depending on the choice of graphene and boron nitride fabrication processes the described layer sequence can be either grown directly or assembled from the layers fabricated separately.

The method may include one or more optional further steps to include one or more further layers. Thus a further graphene layer or layers of other material may be added to the graphene-based composite structure obtained by the above method.

Transistor Devices

According to a second aspect, the present invention provides a transistor comprising:
  a source electrode;
  a drain electrode; and
  an insulating barrier in contact with both the source electrode and the drain electrode, the insulating barrier comprising from 1 to 30 layers of a semiconductor material;
  wherein at least one of the source electrode and drain electrode comprises a layer of graphene and the other electrode comprises a layer of a conductive material.

The insulating barrier is positioned between the source and drain electrodes and is in contact with both. Thus in this aspect, the present invention provides a transistor comprising: a source electrode; a drain electrode; and an insulating barrier in contact with and situated between both the source electrode and the drain electrode, the insulating barrier comprising from 1 to 30 layers of one or more semiconductor materials; wherein at least one of the source electrode and drain electrode comprises a layer of graphene and the other two electrodes comprise a layer of a conductive material.

The transistor of the present invention has a sandwich-like structure comprising at least three layers, but more usually will also contain a number of additional layers as described below. In its simplest form, the invention is directed towards a transistor comprising a top electrode, which can be made of any conductive material, including metal, but which preferably is graphene, an insulating barrier layer on which the top electrode sits and a bottom electrode layer. The insulating layer is therefore sandwiched between the top electrode layer and the bottom electrode layer. The identity of the source electrode and the drain electrode will depend on the bias applied to the transistor and material of the insulating layer.

For ease of reference, in the case of a vertical transistor, we refer to the electrodes as being the "top" electrode and the "bottom" electrode, with the top electrode being the electrode that is present at the top i.e. outside surface (unless also covered by an optional protective layer) of the transistor. Such a structure can be seen in FIG. 4.

The top electrode may be any conductive material. In one preferred embodiment, the top electrode can be a graphene layer. Thus in one particularly preferred embodiment, the top electrode is a graphene layer when the bottom electrode is also made of graphene. In an alternative embodiment, the top electrode is a metal and can, for example, be a doped semiconductor.

In an embodiment, the insulating barrier layer, which is also known as an intermediate layer or a spacer layer, comprises boron-nitride. In another embodiment, the insulating barrier is a semiconductor, for example Si, Ge or a III-V semiconductor such as GaAs or AlGaAs. In another embodiment, the insulating barrier is a chalcogenide or a dichalcogenide of a transition metal i.e. a d-block element. The chalcogenide or dichalcogenide compounds include oxides, sulphides, selenides and tellurides and the preferred chalogenide or dichalcogenide compounds are sulphides or oxides. Particularly preferred compounds include $MoS_2$ and $HfO_2$. In one embodiment mechanically transferred hexagonal BN and $MoS_2$ layers were used for the insulating layer. Alternatively, the insulating barrier is an organic semiconductor or a dielectric. Other suitable materials for the insulating barrier include nitrides such as gallium nitride or silicon nitride, with silicon nitride being preferred. Other suitable materials include oxides such as $SiO_2$ and aluminium oxide. The insulating barrier layer may include one or more layers of materials listed above. The insulating barrier layer may also be formed from a mixture of two or more layers of different material. For instance, the insulating barrier layer may be formed from one or more layers of hexagonal BN and one or more layers of $MoS_2$.

Ideally the intermediate barrier layer is a material which is chemically stable. The nature of the material of the intermediate barrier layer affects the switching ratio of the transistor. For example, using $MoS_2$ switching ratios of up to 10,000 at or near room temperature can be obtained.

In an embodiment, the insulating barrier is a layered material and has a thickness of from one atomic layer to about 50 atomic layers, and more preferably with the upper limit being about 30 atomic layers. Thus, the thickness of the insulating barrier will be up to about 15 nm and more usually up to about 10 nm. One atomic layer normally accounts for a thickness of about 0.35 nm, depending on the composition of the layer.

In an embodiment, the transistor further includes an underlayer onto which the bottom electrode layer is positioned. The underlayer is an insulator which serves to enhance the properties of the bottom electrode layer, such as graphene. The underlayer serves to improve one or more of the following properties: roughness, strain, electrical conductivity and homogeneity, chemical or thermal stability. It can also serve a substrate for graphene growth. Materials that are suitable for the underlayer include hexagonal boron nitride (h-BN).

In a further embodiment, the underlayer itself is disposed on top of a layer of material which acts as a gate insulator. Any known gate insulating material can be used as the gate insulator. Examples include as $SiO_2$, silicon nitride, aluminium oxide, $HfO_2$, etc.

In a further embodiment, the gate insulator and the layers of the transistor above the gate insulator are disposed on top of a layer of material which acts as a gate conductor or gate electrode. The gate conductor or gate electrode can be made of any conductive material with a sufficiently flat surface and, may for example, be a metal or a highly doped semiconductor. A particularly suitable gate conductor or is highly doped silicon and, in one embodiment, this may be used without the need of an additional support. Alternatively, the gate conductor may optionally be fabricated on top of an additional substrate.

Thus, in one embodiment, the transistor of the present invention may have a structure as illustrated in FIG. 4. This transistor is a sandwich structure comprising a top electrode, an intermediate (spacer) layer, a graphene layer, an underlayer, a gate insulator layer and a gate conductor layer.

The method of fabricating the insulating barrier layer, and indeed the transistor device according to the invention, can be, for example, using any of the conventional techniques of semiconductor (insulator) growth and deposition including CVD, PE-CVD, MBE, ALD, thermal or e-beam evaporation, sputtering or a deposition from a liquid solution.

In an embodiment, the insulating barrier comprises from 1 to 30 layers. In one embodiment this material is boron-nitride. In a preferred embodiment, the insulating barrier comprises from 3 to 8 layers of a material such as boron-nitride, e.g. 3, 4, 5, 6, 7 or 8 layers of material. A preferred embodiment is 3 layers of material for the insulating barrier. An alternate embodiment is 4 to 8 layers for the insulating barrier. The insulating barrier may be one or more of a number of materials described below. Thus in one embodiment, the insulating barrier comprises hexagonal boron-nitride, e.g. a hexagonal boron-nitride crystal. In an alternate embodiment, the insulating barrier comprising from 1 to 30 layers, and more preferably 3 to 8 layers, of a dichalcogenide.

In an embodiment, graphene crystals were extracted from bulk graphite and mechanically transferred in order to form the transistor stack. However, graphene layer can be either grown directly on the described substrate (as was the case in FIG. 4), transferred on top of it or transferred together with other layers on top of it from a different substrate where it was fabricated. Examples of methods of growing graphene include CVD (chemical vapour deposition), PE-CVD (plasma enhanced chemical vapour deposition), MBE (molecular beam epitaxy), ALD (atomic layer deposition), DAS and so forth. The graphene can also be chemically modified or functionalized in order to improve the transistor performance. Chemical functionalisation of the graphene may alter the density of states (DOS) and the barrier parameters thus altering the characteristics of the transistor. In this regard, it is possible to tune the properties of the transistor by selecting an appropriately functionalized (or partially functionalized) graphene component. In an embodiment, the graphene or functionalised graphene component is graphene. In a further embodiment, the graphene or functionalised graphene component is graphene which has not been previously chemically modified. Chemical functionalisation of the graphene may also assist in the manufacturing of the transistor. Chemical modification may be achieved using any of the known methods for introducing functional groups such as hydrogen, halogens, and oxygen-containing groups etc. on to graphene as described in the literature.

In an embodiment, the source electrode comprises a layer of graphene.

In an embodiment, the drain electrode comprises a layer of graphene.

In an embodiment, the source electrode comprises a layer of graphene and the drain electrode comprises a layer of graphene.

In an embodiment, the transistor also comprises an encapsulating layer which covers the source electrode. In an embodiment, the encapsulating layer has a thickness of between 1 and 100 nm, e.g. between 20 and 50 nm.

In another embodiment, the transistor also comprises an encapsulating layer which covers the drain electrode. In an embodiment, the encapsulating layer has a thickness of between 1 and 100 nm, e.g. between 20 and 50 nm. In an embodiment, the encapsulating layer comprises BN.

By encapsulating the source and/or drain electrode, the electrode is made less susceptible to its environment. When the electrode comprises a layer of graphene this can be particularly important as it can result in the electrode having improved charge carrier mobility µ. Accordingly, the charge carrier mobility µ of the graphene electrode may be of the order of $100,000$ $cm^2V^{-1}$ $s^{-1}$ or greater, preferably at room temperature (e.g. 20° C.). In an embodiment, the encapsulating layer comprises BN.

Hexagonal boron-nitride is a suitable material for the insulating barrier, because it can act as an atomically smooth and inert substrate for the graphene electrode. Using hexagonal boron-nitride may result in the graphene hetero-structure exhibiting, among other things, room temperature ballistic transport of a 1 µm distance and high charge carrier mobility µ, even at room temperature.

In an embodiment, the drain electrode/source electrode and the insulating barrier all lie directly next to one another, i.e. with no layers therebetween.

The graphene layer of the source electrode/drain electrode is preferably a single sheet of graphene, i.e. it is preferably one atom thick. However, it is also possible for the graphene layer to include multiple sheets of graphene. For example, the graphene layer could include two sheets of graphene (so-called "bilayer graphene") or even three sheets of graphene (so-called "trilayer graphene"). Above three sheets of graphene, the electric properties of the graphene layer may in some cases become less useful. In part, this depends on the other materials present in the transistor. Accordingly, in one embodiment, the graphene layer preferably includes no more than three sheets of graphene.

The graphene layer of the source electrode/drain electrode is preferably shaped, e.g. by removing portions of the layer (e.g. by etching, e.g. by electron-beam lithography and oxygen plasma etching) to form a structure. The structure may include one or more contact regions for connecting the structure to an external device.

The graphene layer of the layer of the source electrode/drain electrode may include one or more contacts, e.g. of metal, e.g. to connect the graphene layer to external electronics. Each of the one or more contacts may be positioned on one or more respective contact regions included in a structure formed in the graphene layer.

The transistor of the present invention may also include a substrate on which the source electrode (or encapsulated source electrode) is positioned. Preferably, the source electrode (or encapsulated source electrode) lies directly next to the substrate, i.e. with no layers therebetween. The substrate preferably include a silicon wafer, preferably an oxidised silicon wafer, e.g. so that the substrate has $SiO_2$ having a thickness approximately equal to between 50 nm and 500 nm, e.g. between 80 nm and 400 nm.

The invention will now be illustrated by the following Figures in which:

FIG. 1(a) is a device schematic of the multilayer sample.

FIG. 1(b) is an optical image of the multilayer sample.

FIG. 1(c) shows experimental results on quantum capacitance (circles) and simulations for different spacer thicknesses (solid lines).

FIG. 3 (Inset) shows $R_{drag}(V_{int})$ at three different temperatures.

Figure 7A:
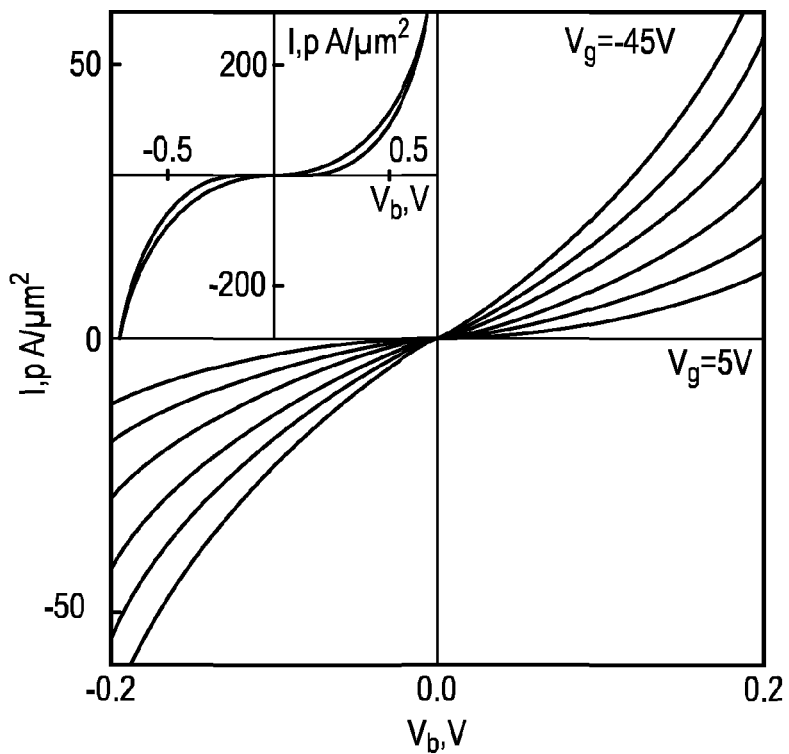
Figure 7B:
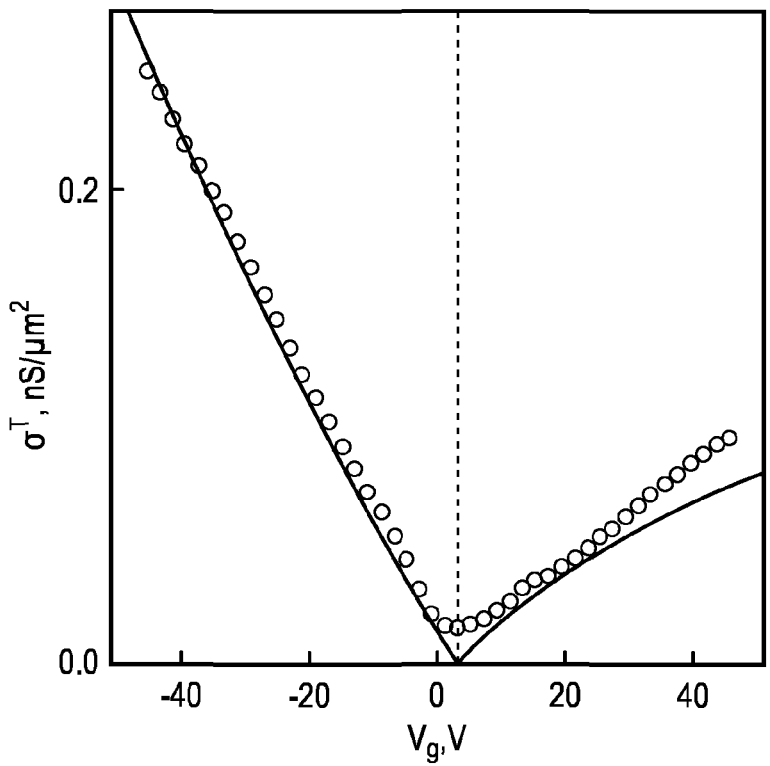
Figure 8:
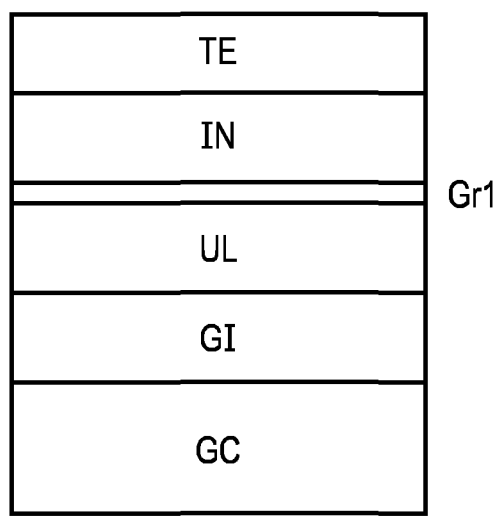
Figure 9A:
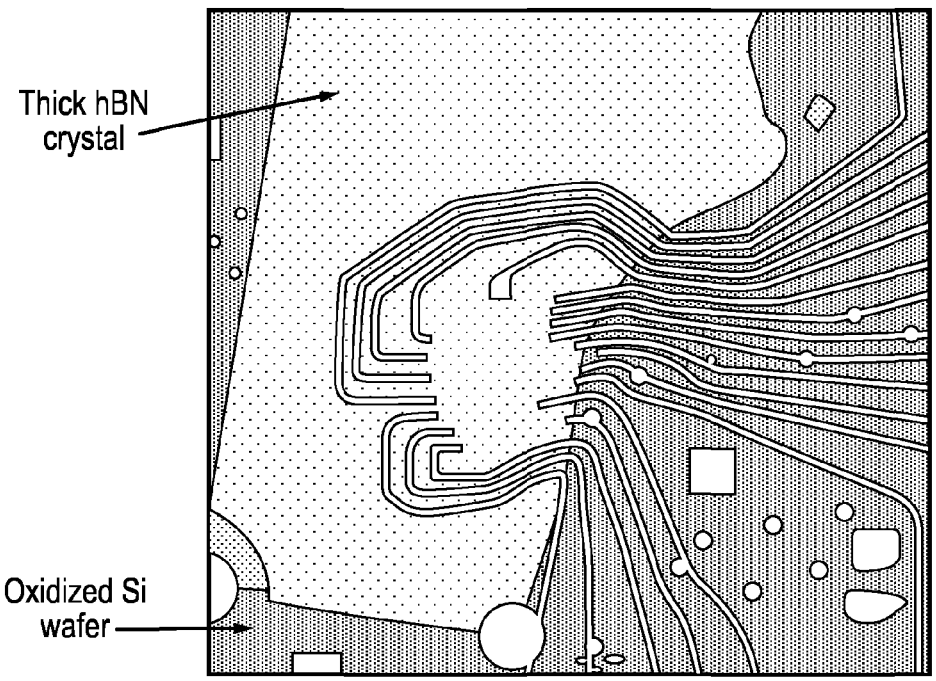
Figure 9B:
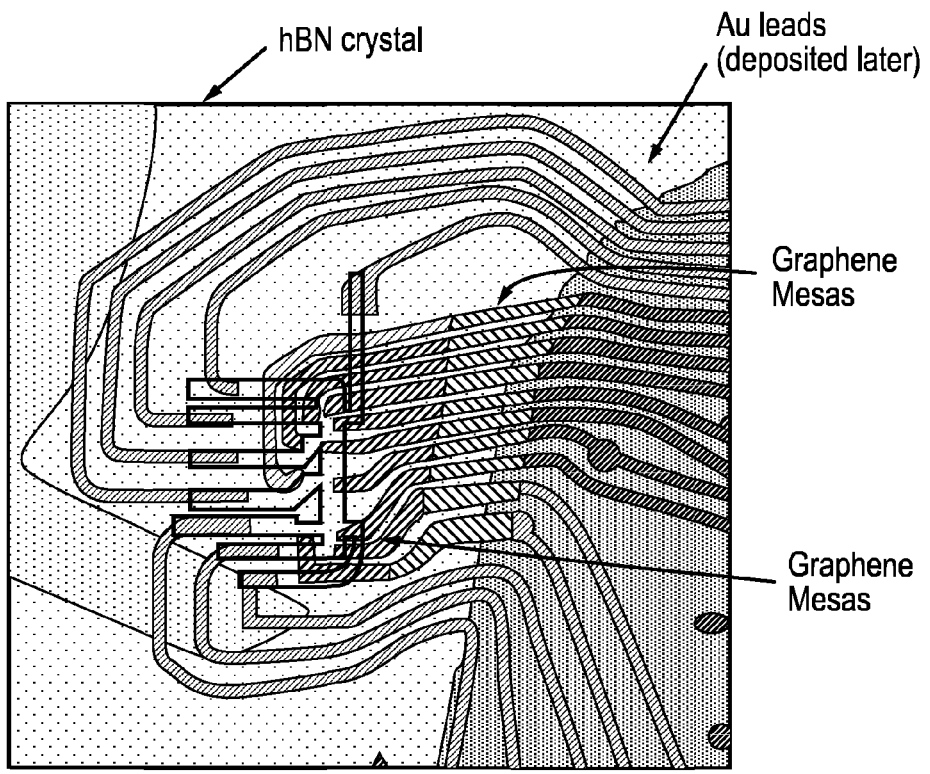
Figure 10:
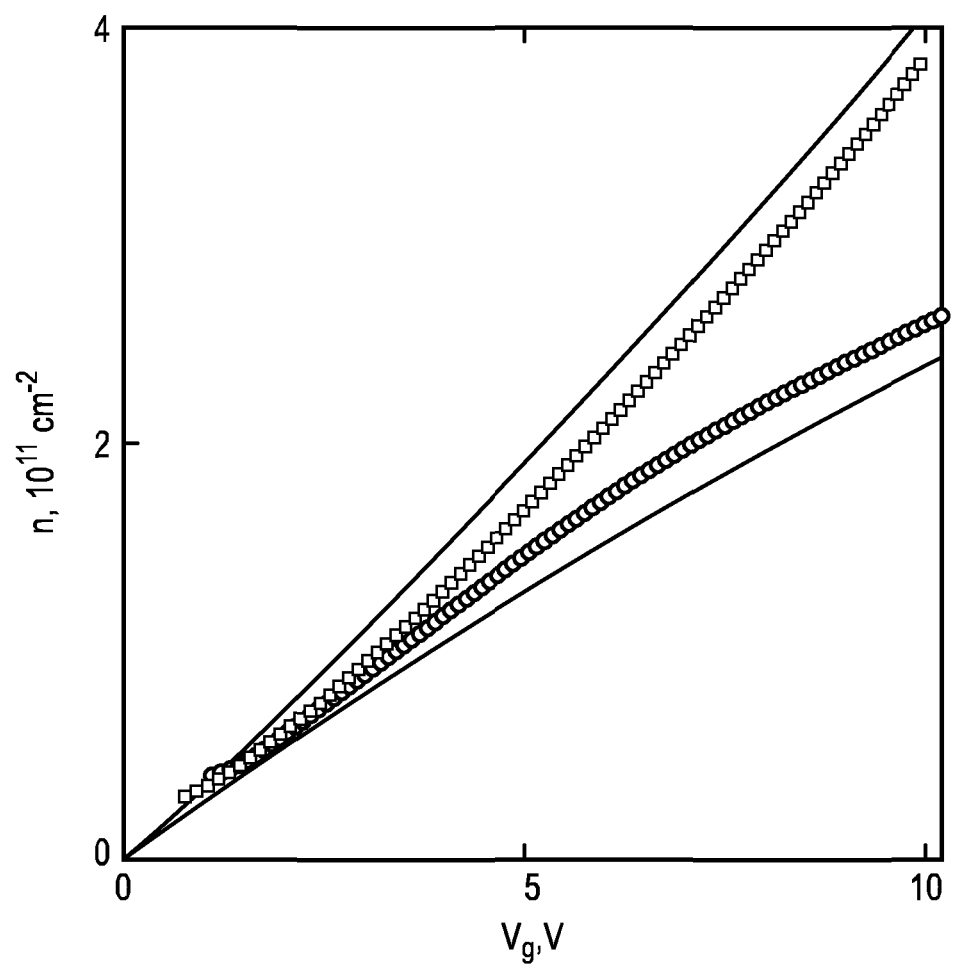
Figure 11A:
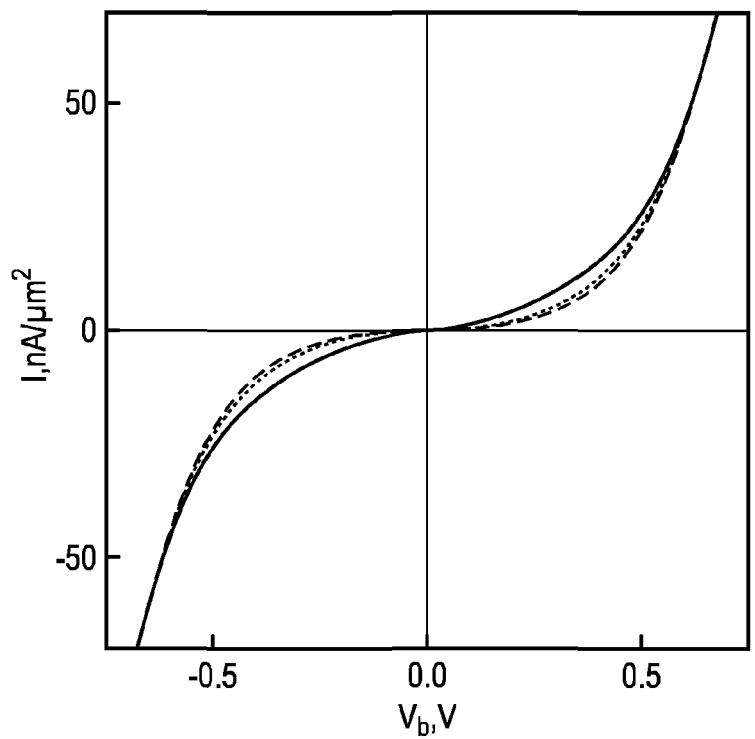
Figure 11B:
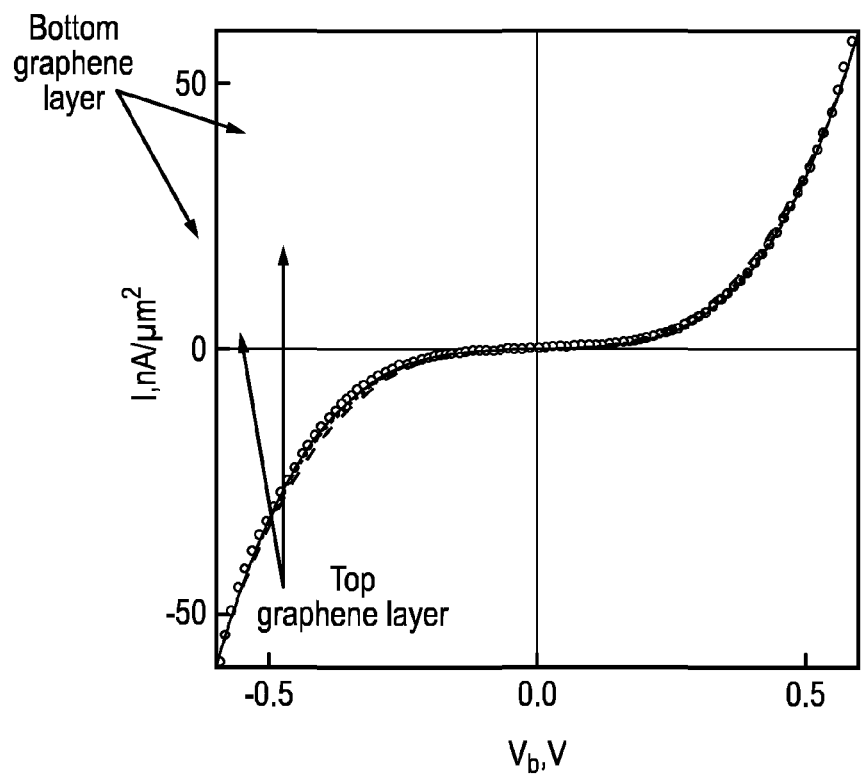
Figure 12A:
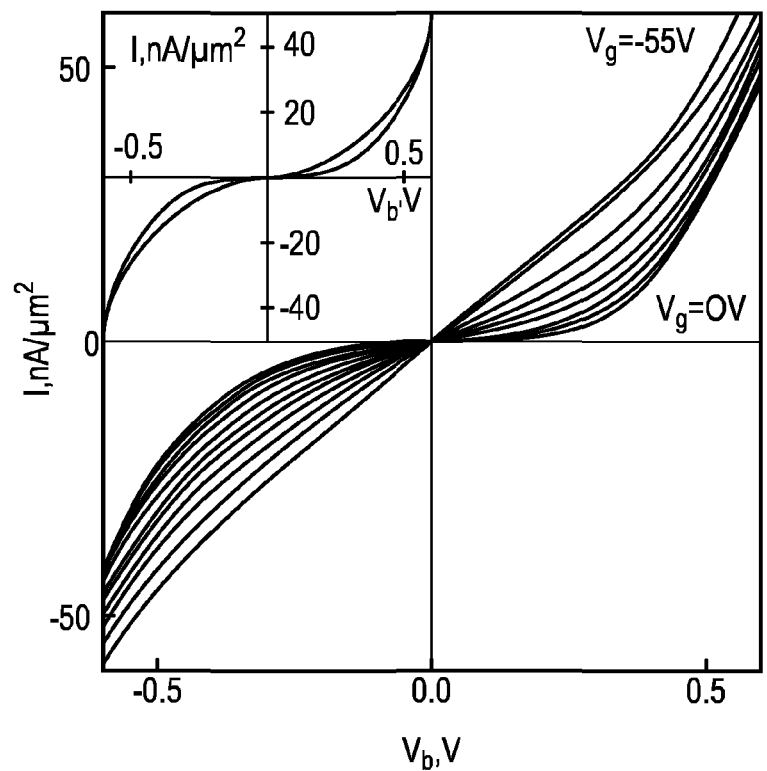
Figure 12B:
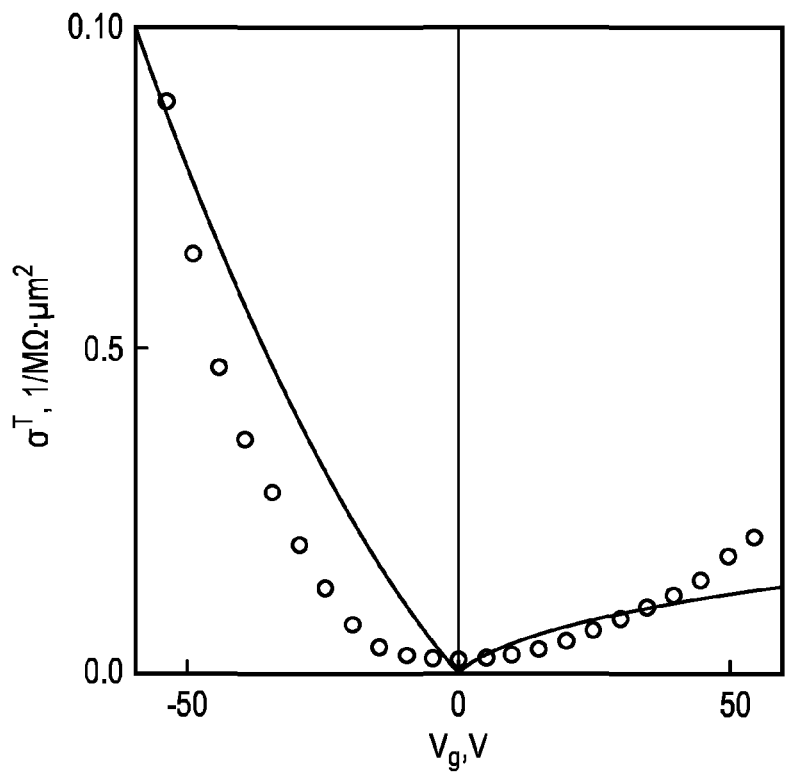

FIGS. 5 (a) to (d) show the operation of the transistor according to the invention, FIGS. 6(a) to (d) show the behaviour of in-plane resistivity ρ for the $Gr_B$ and $Gr_T$ layers as a function of $V_g$ using graphene as a tunneling electrode, FIG. 7 shows the tunneling characteristics for a graphene-hBN device with 6±1 layers of hBN as the tunnel barrier, FIG. 8 shows the structure of one embodiment of a transistor of the second aspect of the present invention, FIG. 9 shows an hBN-graphene-hBN-graphene-hBN device according to the second aspect of the present invention, FIG. 10 shows nonlinear dependence of charge carrier concentrations in the two graphene electrodes of a transistor according to the second aspect of the invention as a function of gate voltage, FIG. 11 shows the tunneling I-V characteristics for two different 4-hBN-layer devices according to the second aspect of the invention at zero gate voltage and their comparison with theory, FIG. 12 shows another hBN-graphene-hBN-graphene-hBN field-effect device according to the second aspect of the invention, and FIG. 13 shows the I-V characteristics of a graphene $MoS_2$ device according to the second aspect of the invention.

EXPERIMENT 1

Coulomb Drag in Nonweakly Interacting Double Layer BN-Graphene Heterostructures

Fabrication of multilayer boron nitride/graphene heterostructures. The developed technique allows to encapsulate graphene between two hexagonal BN crystals while keeping the carrier mobility as high as 10 m²/Vs. The results on transport studies of two closely spaced, independently contacted graphene layers are presented. Due to small interlayer separation, Coulomb drag exhibits unusual behaviour beyond the scope of previously studied weakly interacting regime.

After several years of active transport studies still a little is known about electron-electron interactions in graphene. Due to its minor contribution into the sheet resistance, the direct measurements of the e-e interactions in the conventional transistor structures require complex analysis. Observation of transport properties of two closely spaced graphene flakes can shed light on a variety of new interaction phenomena including, for example, exciton condensation. Electron drag is a very useful tool in probing intra-layer density excitations and inter-layer electron-electron interactions because the drag is caused by the scattering between fluctuations of electron density of two two-dimensional electron gases ("2DEGs"). In this experiment we report on high quality BN/graphene heterostructures and study their transport properties. We explore drag effect in our samples. The present invention allows positioning of two graphene layers an order of magnitude closer than would be the case in comparable GaAs/AlGaAs heterostructures; these graphene layers are separated by only a few nanometer thick BN crystal, while keeping the leak currents vanishingly small. This allows us to reach carrier concentrations as high as $2 \cdot 10^{12}$ by applying a voltage between two layers. Therefore, in combination with the conventional Si back-gate which mainly affects the bottom layer, concentrations in top ($n_t$) and bottom ($n_b$) layers can be controlled independently. Another advantage of this technique is the high mobility of our samples up to room temperature, due to the fact that graphene layers are only in contact with chemically inert and atomically flat hexagonal boron nitride sheets The sample fabrication starts from the deposition of BN crystals on top of $Si/SiO_2$ wafer using standard mechanical exfoliation technique [PNAS]. We then select a clean and uniform BN flake and transfer a large graphene crystal on top of it. After this graphene flake is shaped to a Hall bar using oxygen plasma etching, a few-layer thick BN spacer is again transferred on top of it. The spacer is aligned so that it only covers the hall-bar structure and not graphene 'leads' (see FIG. 4(a)). Finally, the top graphene layer is transferred, followed by the standard contact deposition. Since the part of the bottom flake is still open, the contacts can be made to both layers in one electron beam lithography run. The top layer also can be shaped by a careful etching, following the mesa-structure of the bottom layer. Each stage of transfer is preceded by annealing at 300° C. in $Ar/H_2$ for several hours in order to clean the surface.

FIG. 1(a) is a device schematic of the multilayer sample. The layer order depicted in FIG. 1(a) is as follows: thick BN underlayer (blue), bottom graphene (gray), thin BN spacer (red) and top graphene layer (dark grey).

FIG. 1(b) is an optical image of the multilayer sample. Red line indicates edges of the BN spacer. Although graphene on BN has vanishing contrast at these conditions, the bottom Hall-bar can be seen due to partial etching of BN underlayer. Scale bar is 5 μm.

FIG. 1(c) shows experimental results on quantum capacitance (circles) and simulations for different spacer thicknesses (solid lines).

The transfer procedure involves standard flake deposition on top of Si/PMGI/PMMA stack followed by the lift-off of the PMMA film by etching away PMGI release layer in a weak alkali solution. The top PMMA surface with the flake remains dry during this procedure. The film is then picked up on a support (metal ring), aligned and placed face-down onto the target substrate. The alignment is done using an optical mask aligner with an accuracy of ~2 μm. After the transfer, the PMMA carrier film is dissolved in acetone. The annealing of transferred flakes is often accompanied by formation of microscopic bubbles of organic and gas species, therefore the lithography is done to fit the hall-bar between such bubbles.

We have studied three samples with different spacer thicknesses (d) of 2, 2.8 and 3.6 nm. Although the samples show very similar behaviour, most of the results presented here have been measured on the thicker device, in order to obtain higher carrier concentrations without significant leak issues. The leak through BN interlayer is not detectable (>1 GΩ) at small biases and exponentially rises to ~1 nA at 0.6 V for the thickest device. AFM studies of the device surface confirm that the layers are flat and uniformly spaced with RMS roughness below 1 Å. Each structure has 10 contacts to the bottom layer and at least 6 contacts to the top. The carrier mobility of the bottom layer (up to 15 $m^2V^{-1} s^{-1}$) is superior to that one of the top (2.5-5 $m^2V^{-1} s^{-1}$).

Good quality of interlayer spacer allows us to use a voltage $V_{int}$ between graphene layers in order to control the charge density. Together with the back gate, which mainly affects the bottom layer, different combinations of top ($n_t$) and bottom ($n_b$) layer concentrations can be achieved. However, the carrier density is no longer a linear function of the voltage $V_{int}$.

In order to investigate that, we have studied the capacitance of our devices (FIG. 1(c)). This has been done by measuring the concentration of charge carriers $n(V_{inter})$ from Hall effect: $n=eB/R_H$, where B is magnetic field and $R_H$-Hall resistance. Then the capacitance (per unit area) was obtained by differentiation: $C=edn/dV_{inter}$. This method is valid as soon as there is one type of carriers in the graphene sheet (i.e. not too close to NP). The results presented in FIG. 4(c) show that C is not constant as expected for a capacitor with metal plates. The deviation is due to contribution from quantum capacitance $C_q$ originating from low concentration of charge carriers in graphene and working as a series capacitance. At T=0 and ignoring disorder, $$C_q = \frac{2e^2}{\hbar v_F}\sqrt{\frac{|n|}{\pi}},$$

where $v_F=1.1\cdot 10^6$ m/c is Fermi velocity. The total capacitance is $C=(2/C_q+d/\varepsilon\varepsilon_0)^{-1}$, where $\varepsilon=4.8$ is dielectric constant of BN and factor 2 is due to fact that we have both plates made of graphene. Using thickness as the only fit parameter we obtained d~4 nm, which coincides with result of AFM measurements Here, $\varepsilon=4.8$ is an AC value, with $v_F$ taken as $1.1\times 10^6$.

Since the 2DEGs are in a close proximity, the momentum transfer occurs in scattering events between fluctuations in the electron density of each layer. Passing a driving current $I_a$ in one of the layers (active) results in a drag current being created in the other (passive). The two currents have the same direction in case if both layers have the same carrier type (n-n, p-p) and opposite for n-p (p-n) configuration. Thus, the drag resistance in open circuit configuration $R_{drag}=V_p/I_a$ is negative for n-n (p-p) case, positive for p-n (n-p) case and zero if one of the layers has zero average concentration.

Due to a negligible intrinsic doping observed in our devices (estimate), zero gate voltage result in $E_F=0$ for both layers. Then, a constant voltage is applied to the top layer $V_{int}$ (bottom layer grounded), creating an equal charge density of the opposite signs $n=n_t=-n_b$. For the drag measurements, the bottom layer is used as the active layer and the top layer as passive, though swapping the active and passive layers does not change the drag resistance significantly (within 5%). As expected, the measured drag resistance is independent of driving current (up to 0.5 μA above 20 K) and the same in both AC/DC setups.

Figure 2A:
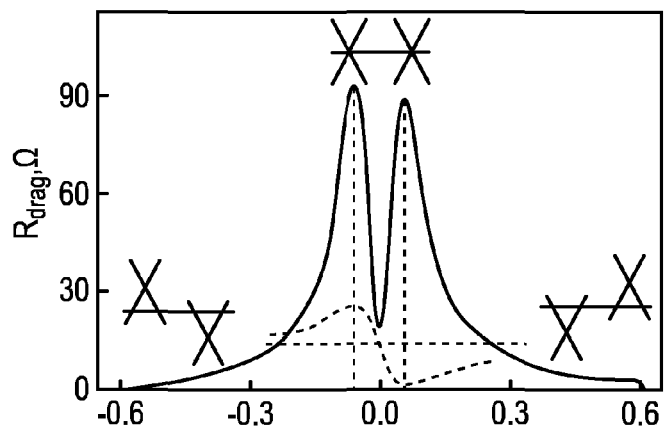
FIG. 2(a) shows drag as a function of interlayer voltage (solid) for the symmetric case.

FIG. 2(a) shows drag as a function of interlayer voltage (solid) for the symmetric case $n=n_t=-n_b$. Dashed line shows $R_{xy}$ for the top layer in B=0.5 T (the same $V_{int}$ scale, vertical scale not shown). Horizontal dotted line indicates $R_{xy}=0$. The diagrams illustrate Fermi energy in the bottom and top layers, respectively. T=124 K.

Figure 2B:
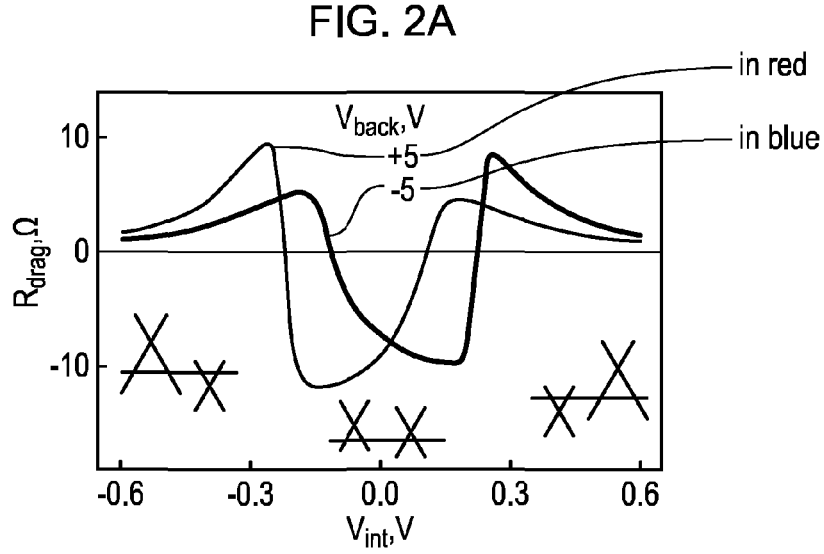
FIG. 2(b) shows the drag resistance in the nonsymmetric case.

FIG. 2(b) shows the drag resistance in nonsymmetric case: negative for the same type of carriers in both layers (black curve-holes, red-electrons) and positive for p-n (n-p) configuration. The diagrams are related to the blue curve. T=124 K.

Figure 2C:
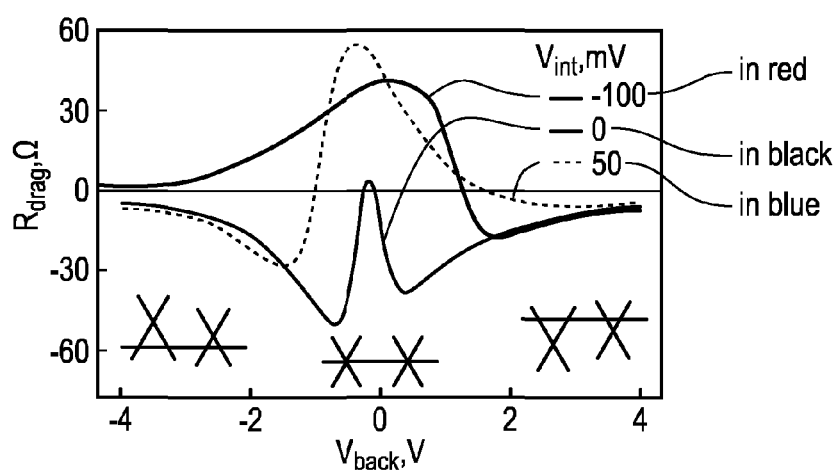
FIG. 2(c) shows $R_{drag}$ as a function of back gate voltage

FIG. 2(c) shows $R_{drag}$ as a function of back gate voltage, with for different $V_{int}$. T=110 K. The diagrams are related to the black curve.

FIG. 2(a) shows $R_{drag}$ measured as a function of the interlayer voltage $V_{at}$, when $V_{back}=0$, i.e. $n=n_t=-n_b$. At the electroneutrality (EN) point $V_{int}=0$ the spatial inhomogeneity breaks graphene into a system of random thermally smeared electron-hole puddles and the average $R_{drag}$ approaches zero. As a more inform concentration develops, $R_{drag}$ abruptly rises, reaches a maximum and then decreases due to the screening induced weakening of the interlayer interaction.

In order to estimate how large the nonuniform region is in $V_{int}$, we measure $R_{xy}$ for the top layer, where the mobility is lower (dashed line in FIG. 2(a)). The maxima and minima in $R_{xy}$ correspond to the crossover from the regime of uniform concentration, when $R_{xy}$ should decrease as $1/n$, to the nonuniform regime, where two types of carriers present due to the finite temperature and potential disorder. Their positions, indicated by the vertical dashed lines at $V_{int}=\pm 0.05$ V, almost exactly match the peaks in the drag resistance $R_{drag}$ (indicated as vertical dotted lines in the plot). We therefore believe, that the central deep in $R_{drag}(V_{at})$ is directly related to nonuniformity of the gas at low energies.

When a finite back-gate voltage $V_{back}$ is applied, both layers have the same type of carriers: the drag resistance is negative as shown in FIG. 2(b). Introducing $V_{int}$ will increase the concentration in one flake and deplete the other. Eventually, the EN point for one of the layers will match the Fermi level—at this point $R_{drag}$ will change sign passing through 0. The size of such transition is again related to the disorder. Since the mobility in the layers differs, two transitions are not symmetric.

The drag resistance can also be measured as a function of $V_{back}$. FIG. 2(c) shows such measurements for different combinations of carrier types: $V_{int}=0$, 50, −100 mV. Due to the partial screening, the back gate voltage affects concentration in two layers in a different way. The further report will be focused on measurements similar to given in FIG. 2(a), due to its symmetrically defined concentrations $n_t$, $n_b$ and intuitive clearness.

Figure 3:
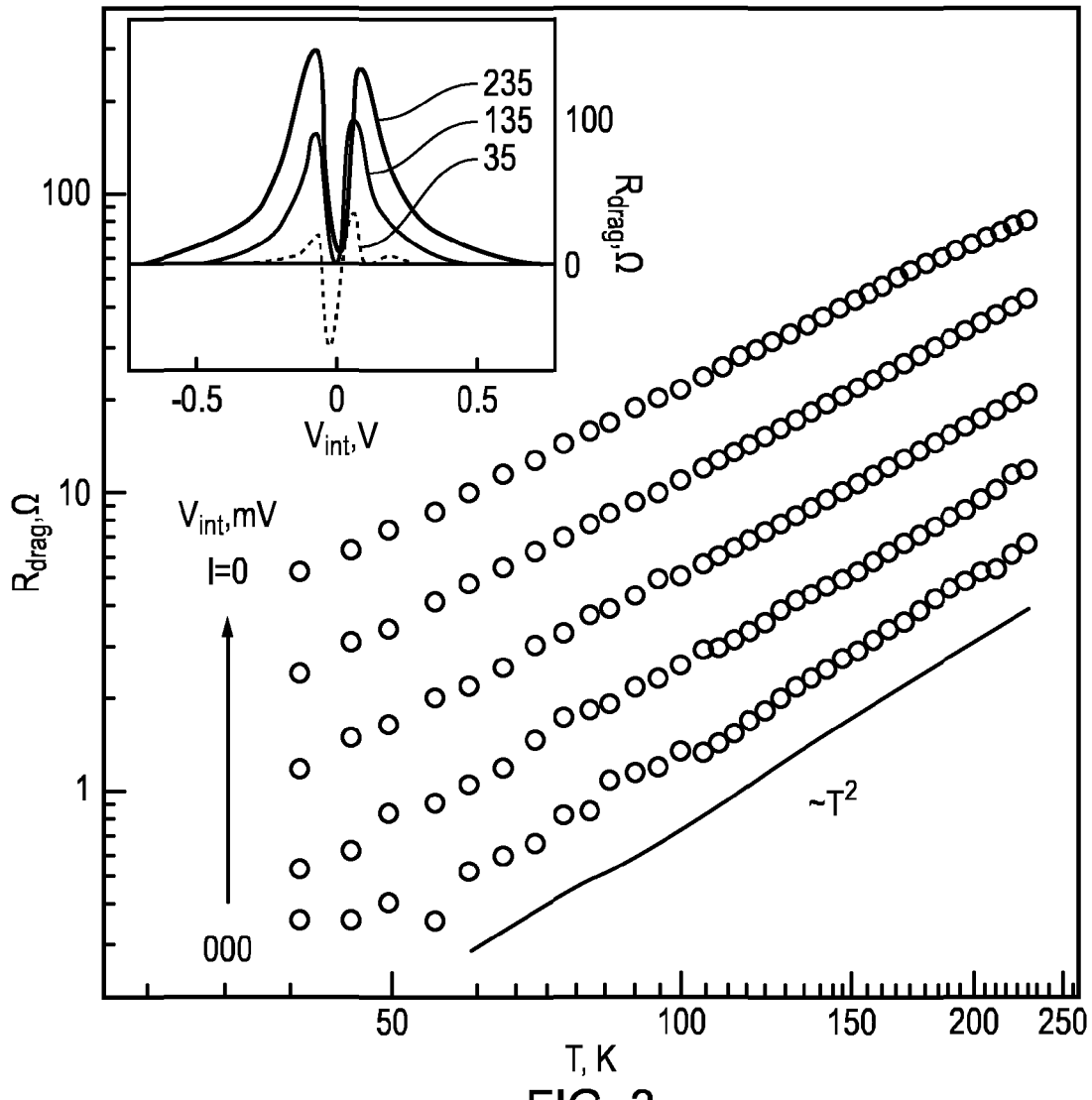
FIG. 3 shows Temperature dependence of drag resistance for different $V_{int}$.

FIG. 3 shows Temperature dependence of drag resistance for different $V_{int}$. Solid line shows slope corresponding to the power of 2. FIG. 3 (Inset) shows $R_{drag}(V_{int})$ at three different temperatures.

Since the Coulomb drag originates from the interlayer scattering processes, it is governed by phase space available for the scattering events. A general theory of Coulomb drag applied to graphene in the literature is based on the second-order perturbation theory in the screened interlayer interaction $U_{12}(\vec{q},\omega)$ dependent on the wave vector $\vec{q}$ and frequency $\omega$. For the ballistic regime when the mean free path l>>d (which is definitely the case for our experimental situation) the drag resistivity can be estimated as $$\rho_D \propto \left(\frac{k_B T}{E_F}\right)^2 \sum_{\vec{q}} |U_{12}(\vec{q},0)|^2 \qquad (1)$$

Inset of FIG. 3 shows experimental T-dependence of the drag effect: $R_{drag}$ decreases as the temperature drops, entering mesoscopic regime at T~30 K. The extracted $R_{drag}(T)$ for different values of the interlayer voltage is shown in FIG. 3 in logarithmic scale. The curves are linear within experimental accuracy, with the slope γ close to 2 at high concentrations.

It is thought that the deviation from the square dependence may originate, for example, due to an auxiliary drag mechanism. There are two possible additional drag mechanisms:

virtual phonon and plasmon drag enhancement. Another possible reason is change in the carrier concentration due to C(T) or $k_B T$.

Now we discuss the concentration dependence of the coefficient at $T^2$. For the case of identical graphene layers the screened interlayer interaction can be obtained from the general expression as $$U_{12}(\vec{q},\omega) = \frac{v_c(q)}{2[v_c(q)\Pi(q,\omega)]^2 \sinh(qd) + [1 + 2v_c(q)\Pi(q,\omega)]\exp(qd)} \quad (2)$$

where the polarization function for graphene $\Pi(q,\omega)$ can be taken from the literature and the Fourier component of the bare Coulomb interaction $v_c(q)$ should be obtained from the solution of electrostatic problem for our geometry. For the three-domain medium with the dielectric constant distribution:

$$\varepsilon = \begin{cases} \varepsilon_1, & z > d \\ \varepsilon_2, & d > z > 0 \\ \varepsilon_3, & z < 0 \end{cases}$$

one has $$v_c(q) = \frac{8\pi e^2 \varepsilon_2 \exp(qd)}{q[(\varepsilon_2 + \varepsilon_1)(\varepsilon_2 + \varepsilon_3)\exp(2qd) - (\varepsilon_2 - \varepsilon_1)(\varepsilon_2 - \varepsilon_3)]}. \quad (3)$$

Previous theoretical works on drag in graphene described the regime of weak interaction, when the interlayer distance is much greater than the size of screened electron density fluctuations $\kappa d \gg 1$, where $\kappa = 4e^2 k_F / \hbar v \in$ is the inverse Thomas-Fermi screening radius and $\in$ is an average dielectric constant of the media. According to the theory of Coulomb drag in graphene, the drag resistance $R_{drag}$ is proportional to $T^2 d^{-4} n_t^{-3/2} n_b^{-3/2}$.

Figure 4:
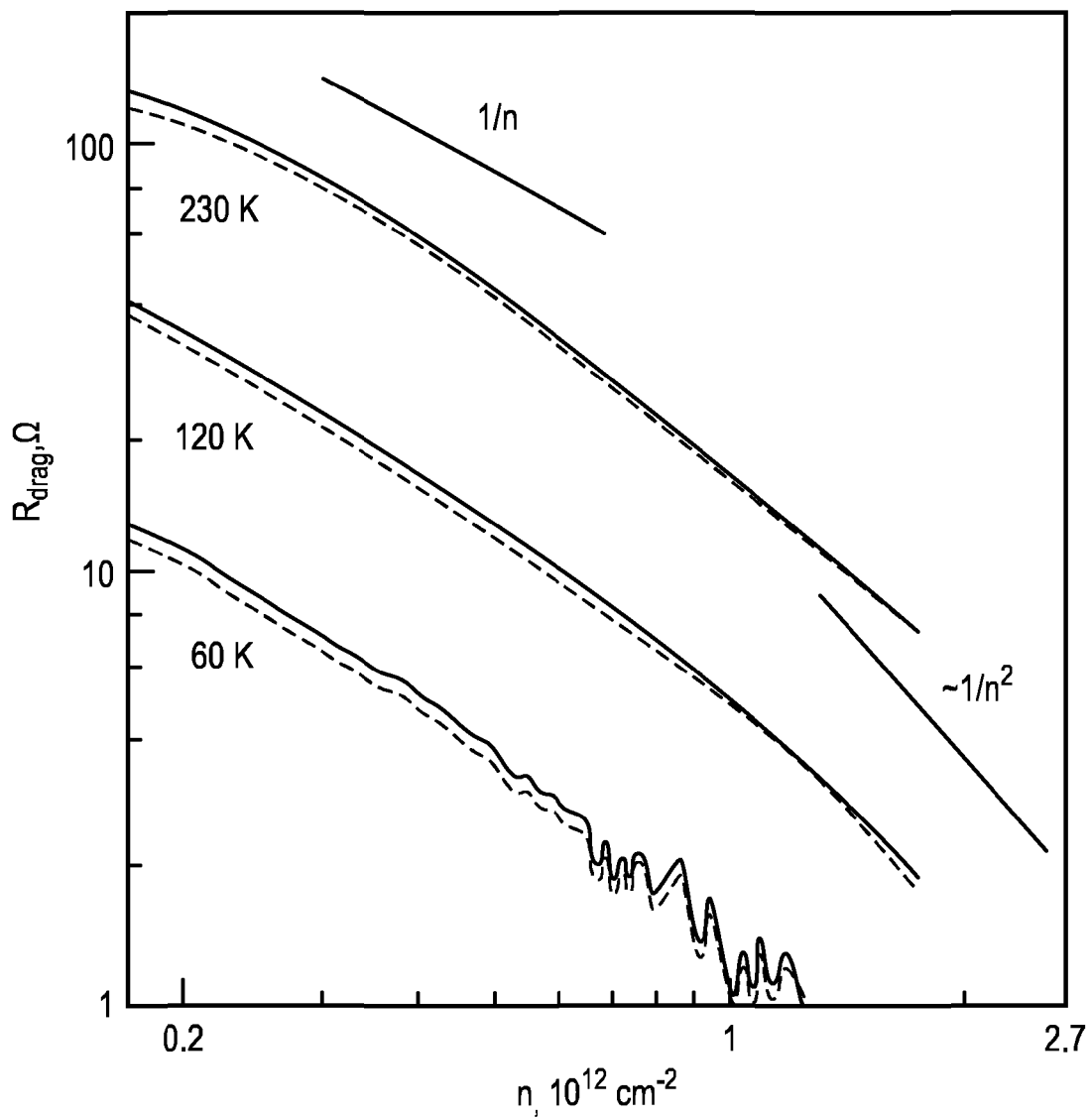
FIG. 4 shows $R_{drag}(n)$ in logarithmic scale.

Clearly, we are not in the limit of the theoretical works. In the carrier concentration of $2 \cdot 10^{12}$ cm$^{-2}$ in our devices, the parameter $\kappa d$ is close to 1, always being lower otherwise. Comparison with our experimental results reveals significant deviation from $n^{-3}$ dependence. FIG. 4 shows the drag resistance from FIG. 2(a) plotted in logarithmic scale as a function of n. As one can see the slope increases, almost reaching $n^{-2}$ at high concentration. The slope behaviour reproduces for both positive and negative n (solid and dashed curves) and does not depend on the temperature (different colours represent different temperatures). The fact that the slope increases with the parameter $\kappa d$ may suggest that it can eventually reach 3 when $\kappa d \gg 1$ is satisfied.

The computational results based on Eqs. (1)-(3) are shown in the FIG. 4 as solid green line and indeed are close to the experimental results. Note that for the opposite limit $\kappa d \gg 1$ the concentration dependence of the drag resistivity is $$\rho_D(n) \propto \frac{1}{n} \ln \frac{1}{\kappa d} \propto \frac{1}{n} \ln \frac{1}{nd^2}.$$

FIG. 4 shows $R_{drag}(n)$ in logarithmic scale. Different colours correspond to different temperatures, solid and dashed lines are for positive and negative n respectively. Purple solid line is a guide for $n^{-1}$. The results of our calculations are presented by the green line and close to $n^{-2}$.

EXPERIMENT 2

The structure and operational principle of our 'proof of concept' FET are shown in FIG. 5.

The tunnelling current is a function of the density of states (DOS) and the barrier parameters (shape and height). In the OFF state (i.e. when there is no gate voltage) the Fermi level in both graphene layers is close to electro-neutrality point, where the DOS is very low. The barrier is undisturbed when no bias applied as can be seen from FIG. 1b)

In the ON state, the applied gate voltage induces carriers in both layers, which are transferred to the Fermi energy shift. The Fermi energy shift is quite high due to the fact that DOS is linear in graphene. This means that the effective barrier height (which is counted from the Fermi energy level) can significantly change. This is illustrated in FIG. 5 (c).

So far, this covers two of the three factors affecting the tunnelling current: (i) the higher DOS at lifted Fermi energy, and (ii) the smaller effective tunnelling barrier which is mainly due to the linear DOS. There is, however, third factor affecting the tunnelling current: the fact that the gate electric field is not completely screened by the bottom graphene layer. This 'penetrated' electric field induces charge carriers in the top layer. The 'penetrated' electric field also changes the properties of the barrier itself which results in a higher tunnelling current. In effect, the shape of the barrier is changed because of the field penetration.

In conclusion, there are three contributions in ON state current: the higher DOS, the smaller effective barrier (both due to the quick change in Ef, i.e. linear DOS of graphene), and the change of the barrier shape. The change of the barrier shape is due to the field penetration—the size of this contribution largely depends on the material that the intermediate insulating layer (also called the spacer layer or the interlayer) is made of.

Figure 5A:
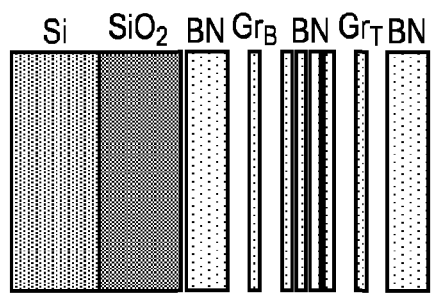

This is illustrated in FIGS. 5A, B, C, D for electrons. FIG. 5 thus shows a graphene field-effect tunneling transistor. (A) Schematic structure of our experimental devices. In the most basic version of the FET, only one graphene electrode ($Gr_B$) is essential and the outside electrode can be made from a metal. (B) The corresponding band structure with no gate voltage applied. (C) The same band structure for a finite gate voltage $V_g$ and zero bias $V_b$. (D) Both $V_g$ and $V_b$ are finite. The cones illustrate graphene's Dirac-like spectrum and, for simplicity, we consider the tunnel barrier for electrons.

However, since graphene spectra is symmetric, the transistor can work with both electrons or holes. That said, it should be noted that the barrier is not symmetric so there is a preferential polarity when different materials are used for the interlayer. Replacing top graphene electrode with another conductor will cause further asymmetry, so different combinations of materials (for the intermediate layer and the top electrode) can be use to enhance or tune the switching ratio. It is therefore possible to control the switching ratio by the choice of suitable materials for the intermediate layer and the top electrode. For example, we have been able to achieve very high switching ratios of about 10000 by using a material such as molybdenum disulphide as the interlayer. The high switching ratio is due to the carrier population in the lower graphene sheet filling up very quickly due to its low linear density of states.

For convenience of characterization, both source and drain electrodes were made from graphene layers in the multiterminal Hall bar geometry. This allows us to measure not only the tunnel current-voltage curves (I-V) but also the behavior of the graphene electrodes, thus providing additional information about the transistor operation. The tunnel barrier is hexagonal boron-nitride (hBN), and the core graphene-hBN-graphene structure is encapsulated in hBN to allow higher quality of the graphene electrodes. The whole sandwich is placed on top of an oxidized Si wafer that acts as a gate electrode (FIG. 1A,B).

When a gate voltage $V_g$ is applied between the Si substrate and the bottom graphene layer ($Gr_B$), the carrier concentrations $n_B$ and $n_T$ in both bottom and top electrodes increase due to the weak screening by monolayer graphene, as shown schematically in FIG. 10. The increase of the Fermi energy $E_F$ in the graphene layers leads to a reduction in $\Delta$ for electrons tunneling predominantly at this energy. In addition, as shown in the figure, the effective height also decreases relative to the NP because the electric field penetrating through $Gr_B$ alters the shape of the barrier. Furthermore, the increase in the tunneling DoS as $E_F$ moves away from the NP leads to an increase in the tunnel current I. Depending on parameters, any of the above three contributions can dominate changes in I with varying $V_g$.

We emphasize that the use of graphene in this device architecture is critical because this exploits graphene's low DoS which, for a given change in $V_g$, leads to a much larger increase in $E_F$ compared to a conventional two-dimensional gas with parabolic dispersion [cf. S. Luryi, Quantum capacitance devices. App. Phys. Lett. 52, 501-503 (1988)]. This translates into much larger changes of both $\Delta$ and tunneling DoS.

To fabricate the device shown in FIG. 5A, we first prepared relatively thick hBN crystals on top of an oxidized Si wafer (300 nm of $SiO_2$) using the standard cleavage technique (K. S. Novoselov et al., Two-dimensional atomic crystals. *Proc. Natl. Acad. Sci. USA* 102, 10451-10453 (2005).). The crystals served as a high-quality atomically-flat substrate. Monolayer graphene ($Gr_B$) was then transferred onto a selected hBN crystal (20-50 nm thick) using a dry transfer procedure (C. R. Dean et al., Boron nitride substrates for high-quality graphene electronics. *Nature Nano* 5, 722-726 (2010)). After deposition of metal contacts (5 nm Ti/50 nm Au) and etching to form a multiterminal Hall bar mesa, the structure was annealed at 350° C. in forming gas. A few-atom-thick hBN crystal was identified using optical and raman signatures and transferred on top of $Gr_B$ by using the same procedures.

This hBN layer served as the tunnel barrier. The whole process of positioning, annealing and defining a Hall bar was repeated to make the second (top) graphene electrode ($Gr_T$). Finally, a thick hBN crystal encapsulated the entire multilayer structure (FIG. 5A; FIG. S1). We tested devices with tunnel barriers having thickness d from 1 to 30 hBN layers. To illustrate the basic principle of the tunneling FETs, we focus on the data obtained from four devices with a tunnel barrier made of 4-7 layers and discuss the changes observed for other d.

FIG. 6 shows graphene as a tunneling electrode. (A) Resistivities of the source and drain graphene layers as a function of $V_g$. (B-D) Carrier concentrations in the two layers induced by gate voltage, which were calculated from the measured Hall resistivities $\rho_{xy}$ using the standard expression $n=B/e\rho_{xy}$, where B is the magnetic field and e the electron charge. Close to the NP, the spikes appear (shown by dotted curves) because the above expression is not valid in the inhomogeneous regime of electron-hole puddles. The shown device has a 4-layer hBN barrier.

Figures 6A, 6B, 6C, 6D:
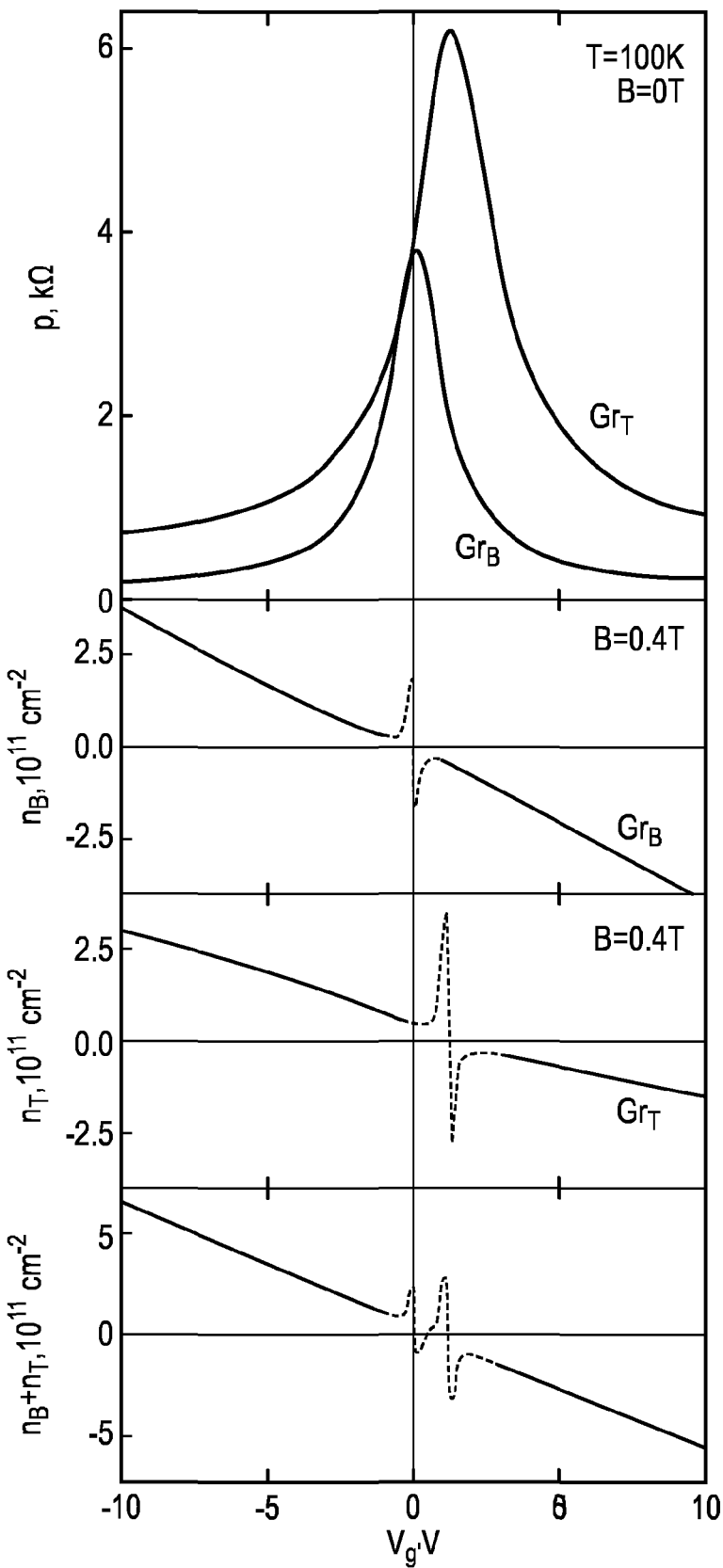

FIG. 2A shows the behavior of in-plane resistivity p for the $Gr_B$ and $Gr_T$ layers as a function of $V_g$. The curves indicate little residual doping for encapsulated graphene ($\approx 0$ and $<10^{11}$ cm$^{-2}$ for $Gr_B$ and $Gr_T$, respectively). In both layers, $\rho$ strongly depends on $V_g$ showing that $Gr_B$ does not screen out the electric field induced by the Si-gate electrode. The screening efficiency can be quantified by Hall effect measurements (FIG. 6B-D). They show that the gate induces approximately the same amount of charge in both layers at low concentrations; that is, there is little screening if $n_B$ is small. As the concentration in $Gr_B$ increases, the $n_B(V_g)$ and $n_T(V_g)$ dependences become super- and sub-linear, respectively (FIGS. 6B&C). This is due to the increase in $n_B$ which leads to an increasingly larger fraction of the gate-induced electric field being screened out by $Gr_B$. Hence more electrons accumulate in the bottom graphene electrode and fewer reach the top electrode. The total charge accumulated in both layers is linear in $V_g$ (FIG. 6D), as expected. We can describe the observed redistribution of the charge between the two graphene layers in terms of the corresponding sequential circuit including the quantum capacitance of the graphene layers (FIG. S2). Note that, for a parabolic band, the ratio between $n_B$ and $n_t$ would be independent on $V_g$ and, therefore, the electric field penetrating into the tunnel barrier would be significantly reduced even in the limit of zero $n_B$.

FIG. 7 shows the tunneling characteristics for a graphene-hBN device with 6±1 layers of hBN as the tunnel barrier. (A) I-Vs for different $V_g$ (in 10V steps). Note, that due to finite doping, the minimum tunneling conductivity is achieved at $V_g \approx 3V$. The inset compares the experimental I-V at $V_g=5V$ (red curve) with theory (dark) which takes into account the linear DoS in the two graphene layers and assumes no momentum conservation. Further examples of experimental curves and their fitting can be found in supplementary material (18). (B) Zero-bias conductivity as a function of $V_g$. The symbols are experimental data, and the solid curve is our modeling. The curve is slightly shifted with respect to zero $V_g$ because of remnant chemical doping. In all the calculations, we assumed the hole tunneling with m=0.5 $m_0$ and $\Delta \approx 1.5$ eV (29,30) and used d as measured by atomic force microscopy. Both I and $\sigma$ are normalized per tunnel area, which was typically 10 to 100 μm$^2$ for the studied devices. Temperature: 240 K.

A bias voltage $V_b$ applied between $Gr_B$ and $Gr_T$ gives rise to a tunnel current through the thin hBN barrier which scales with device area. FIG. 7A shows I-V characteristics for one of our devices at various $V_g$. First, we consider the case of zero $V_g$. At low $V_b$, I is linear in bias, yielding tunnel resistivity $\rho^T=V_b/I \approx 100$ GΩ·μm$^2$ for this hBN thickness. At higher voltages ($V_b$ above ~0.1V), I grows more rapidly. The I-V curves can be described (inset in FIG. 7A; FIG. S3) by the standard quantum-tunneling formulae (J. G. Simmons, Generalized formula for the electric tunnel effect between similar electrodes separated by a thin insulating film. *J. App. Phys* 34, 1793-1803 (1963)) assuming energy conservation but no momentum conservation at the mismatched graphene-hBN interface.

As shown below, we can distinguish experimentally between electron and hole tunneling and find that the tunneling is due to holes. This is in agreement with a recent theory for the graphene-hBN interface which suggests a separation between the Dirac point in graphene and the top of the hBN valance band of $\approx 1.5$ eV whereas the conduction band is $>4$ eV away from the Dirac point. The fit to our data with $\Delta=1.5$ eV yields a tunneling mass m$\approx 0.5$ m$_0$ (m$_0$ is the free electron mass), in agreement with the effective mass for holes in hBN. Furthermore, our analysis indicates that/varies mainly due to the change in the tunneling DoS, whereas the change in tunneling probability with applied bias is a significant but secondary effect. This is due to the fact that, for our atomically-thin barriers with relatively low $\rho^T$, we are not in a regime of exponential sensitivity to changes in $\Delta[E_F(V_b)]$.

To demonstrate the transistor operation, FIG. 7A plots the influence of gate voltage on I. $V_g$ significantly enhances the tunnel current and the changes are strongest at low bias. The field effect is rather gradual for all gate voltages up to ±50V, a limit set by the electrical breakdown of our SiO$_2$ gate dielectric at typically ≈60V. To quantify this behavior, FIG. 7B plots the low-bias tunneling conductivity $\sigma^T = I/V_b$ as a function of $V_g$. The influence of $V_g$ is clearly asymmetric: $\sigma^T$ changes by a factor of ≈20 for negative $V_g$ (holes) and by a factor of 6 for positive $V_g$ (electrons). We observed changes up to ≈50 for hole tunneling in other devices and always the same asymmetry (FIG. S4). Also, the I-V curves of the devices showed little change between room and liquid-helium temperatures, as expected for $\Delta \gg$ thermal energy.

Figure 5B:
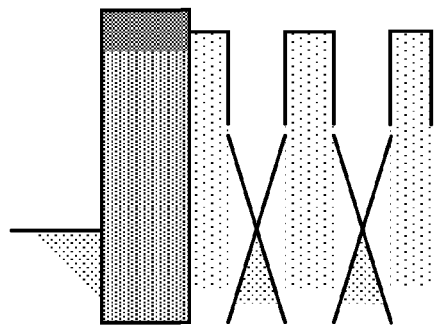
Figure 5C:
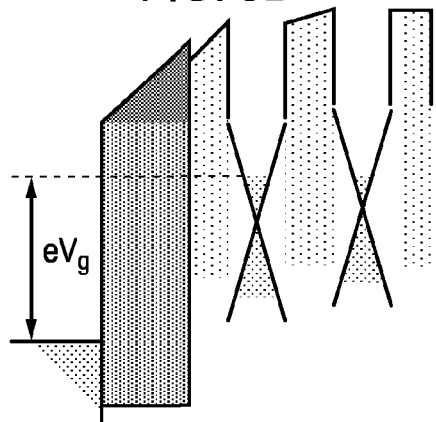
Figure 5D:
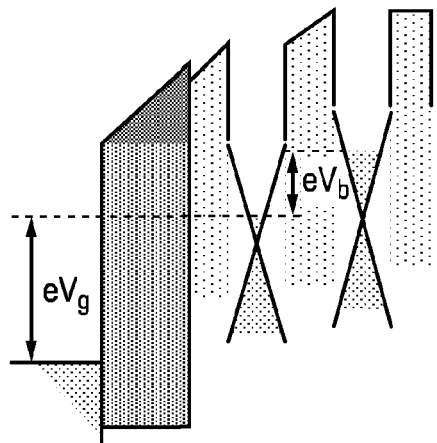

To analyze the observed behavior of $\sigma^T(V_g)$, we modeled the zero-bias conductivity by using the relation $\sigma^T \propto \text{DoS}_B(V_g) \times \text{DoS}_T(V_g) \times T(V_g)$, where the indices refer to the two graphene layers and $T(V_g)$ is the transmission coefficient through the hBN barrier. The resulting curve shown in FIG. 7B explains qualitatively the main features in the measured data, using self-consistently the same tunneling parameters m and $\Delta$ given above. At $V_g$ close to zero, corresponding to tunneling from states close to the NP, the tunneling DoS in both graphene layers is small and non-zero, due to residual doping, disorder and temperature. The application of a gate voltage of either polarity leads to a higher DoS and, therefore, higher $\sigma^T$. The gradual increase in $\sigma^T(V_g)$ for both polarities in FIG. 7B is therefore due to the increasing DoS. However, $V_g$ also affects the transmission coefficient. Due to the shift of $E_F$ with changing $V_g$, the effective barrier height $\Delta$ decreases for one sign of charge carriers and increase for the other (FIG. 5B). This explains the asymmetry in both experimental and calculated $\sigma^T(V_g)$ in FIG. 7B: It is due to the change in $T(V_g)$. This clearly shows that for our devices the effect of $V_g$ on $T(V_g)$ is relatively weak (non-exponential) and comparable with the effect due to changes in the tunneling DoS. The sign of the asymmetry infers that the hBN barrier height is lower for holes than for electrons, in agreement with graphene-hBN band structure calculations. The weaker dependence of/on $V_g$ at high bias is also understood in terms of the more gradual increase in the tunneling DoS and in $E_F$ at high doping ($V_b$=0.5V correspond to $n_g \approx 10^{13}$ cm$^{-2}$).

Our results and analysis suggest that higher ON-OFF ratios could be achieved by using either higher $V_g$ or making devices with larger d, so that the tunneling depends exponentially on bias and is controlled by the barrier height rather than the DoS. The former route is limited by the electrical breakdown of dielectrics at ~1V/nm ($V_g \approx 300V$ for our SiO$_2$ thickness). By extrapolating the analysis shown in FIG. 8B to such voltages, we find that ON-OFF ratios>10$^4$ would be possible for our 4-7 layer devices if SiO$_2$ of highest quality were used. However, it would still require unrealistically large $V_g$ to enter the regime where $E_F$ becomes comparable with $\Delta$ and changes in $\sigma^T(V_g)$ are exponentially fast. Therefore, we have tried the alternative option and investigated devices with both thinner and thicker hBN barriers.

For 1 to 3 hBN layers, we find that zero-bias $\sigma^T$ increases exponentially with decreasing number of layers, consistent with quantum tunneling, and we observe a weaker influence of $V_g$ on I, as expected for the more conductive regime. On the other hand, the thicker hBN barriers are prone to electrical breakdown. Nonetheless, for a few devices with d≈6 to 9 nm we were able to measure a tunnel current without breakdown. A significant current (>10 pA) appeared at biases of several volts and increased exponentially with $V_b$. The thicker devices' I-V characteristics could be fitted using the same hole-tunneling parameters used above, thus indicating quantum tunneling rather than an onset of electrical breakdown. Unfortunately, no significant changes (exceeding 50%) in the tunnel current could be induced by $V_g$. This insensitivity to gate voltage remains to be understood but is probably due to charge traps that screens the influence of the gate.

An alternative method to achieve an exponential dependence of the tunneling current on gate voltage is to use a barrier dielectric with a smaller A, that would be comparable with typical $E_F$ realizable in graphene. One of such candidate materials is MoS$_2$, which has a band gap of about 1.3 eV and can be obtained in a mono- or few-layers state similar to hBN and graphene. Our first hBN-graphene-MoS$_2$-graphene-hBN devices demonstrate ON-OFF ratio close to 10,000, which is sufficient for certain types of logic circuits.

FIG. 8 shows the structure of a graphene vertical FET according to one embodiment of the invention. In FIG. 8 the various component layers are identified as follows: GC=gate conductor, GI=gate insulator, UL=underlayer material, Gr1=graphene layer, IN=intermediate insulating layer (also called spacer layer or the interlayer), and TE=top electrode. The structure also may contain, if necessary, a top protective layer (not shown in FIG. 8).

Field-Effect Tunneling Transistor Based on Vertical Graphene Heterostructures

Example 1

Experimental Structures

Our devices contain two graphene Hall bars placed on top of each other with a thin layer of hBN in between. FIG. 9 shows one of the studied devices. The turquoise area in FIG. 9A is a thick hBN crystal on top of an oxidized Si wafer (brown-purple). The hBN layer served as a substrate to ensure the quality of the bottom graphene electrode. The actual graphene-hBN-graphene-hBN sandwich is highly transparent and practically invisible on this image taken in an optical microscope (FIG. 9A). Nonetheless, one may discern a mesa structure in the central area between the Au leads. The multilayer Hall bar geometry is illustrated in FIG. 9B. This is an electron micrograph of the same device but before depositing Au contacts. The colored image of various layers was used at a design stage for the last round of electron-beam lithography. The Au leads (deposited later) are shown in violet, and two graphene mesas in orange and green. The hBN crystal used as the tunnel barrier can be seen as a light grey patch of irregular shape. Its thickness was determined using atomic force microscopy, Raman microscopy and optical contrast.

FIG. 9 shows an hBN-graphene-hBN-graphene-hBN device according to the invention. (A) Optical image of the final device. (B) Electron micrograph of the same device at the final design stage before evaporating Au leads. Two 10-terminal Hall bars made from graphene are shown in green and orange. The spatial scale is given by the width of the Hall bar, which was 2 µm for this device. Fabrication required 4 dry transfers and alignments of the graphene and hBN crystals, 4 nonconsecutive rounds of electron-beam lithography, 3 rounds of plasma etching and two separate metal depositions.

Example 2

Penetration of Electric Field Through the Graphene Electrode

Consider the geometry shown in FIG. 5A above. The external electric field between the Si and bottom graphene electrodes, which are separated by distance D, is $F_g=V_g/D$ (dielectric constants for both $SiO_2$ and hBN are similar and, for simplicity, we assume them both equal to $\epsilon$). The electric field $F_b$ between $Gr_B$ and $Gr_T$ and the induced carrier densities in the graphene plates $n_T$ and $n_B$ are related by the equations $$\epsilon(F_b-F_g)=4\pi n_B e$$

$$-\epsilon F_b=4\pi n_T e$$

A bias voltage $V_b$ between the two graphene electrodes is given by $$eV_b=eF_b d-\mu(n_T)+\mu(n_B)$$

where d is the hBN thickness and $\mu(n)$ are the chemical potentials in the corresponding graphene layers. For simplicity, we assume that graphene electrodes are chemically undoped and, therefore, $n_T=n_B=0$ in the absence of applied voltages.

Taking into account the electron-hole symmetry $\mu(-n)=-\mu(n)$, we obtain the following equation $$\frac{4\pi e^2 d}{\epsilon}n_T+\mu(n_T)+\mu\left(n_T+\frac{\epsilon F_g}{4\pi e}\right)+eV_b=0 \quad (S1)$$

which allows us to determine $n_T$ induced by the field effect in $Gr_T$ for a given $V_g$. For a conventional two-dimensional (2D) electron gas, $\mu(n)\propto n$ and the first term in eq. (S1), which describes the classical capacitance of the tunnel barrier, is dominant for any realistic d, larger than interatomic distances. In graphene with its low DoS and Dirac-like spectrum, $\mu(n)\propto \sqrt{n}$ and this leads to a qualitatively different behavior, which can be described in terms of quantum capacitance.

The above expressions were employed to find $n_T$ and $n_B$ as a function of bias $V_b$ and gate voltage $V_g$ and the results were then used to model the I-V characteristics (see the theory curves in FIG. 7 above. To illustrate the agreement between the experiment and theory at the intermediate stage of determining $n_T$ and $n_B$, FIG. 10 shows the same experimental data for carrier concentrations in the top and bottom graphene layer $n(V_g)$ as in FIG. 2B,C and compares them with the behavior expected from solving eq. (S1).

FIG. 10. Nonlinear dependence of charge carrier concentrations in the two graphene electrodes as a function of gate voltage. The symbols are experimental data (red symbols for the bottom graphene layer; blue for the top). The solid curves in the corresponding colors are our modeling. No fitting parameters are used.

Example 3

Modeling of Our Device Operation

I-V curves for a tunnel junction are generally described by the expression:

$$I(V)\propto\int dE DoS_B(E)DoS_T(E-eV)T(E)[f(E-eV)-f(E)] \quad (S2)$$

where $f(E)$ is the Fermi distribution function. At low temperatures the difference of the Fermi functions restricts the relevant energy E integral to $\mu<E<\mu+eV$ where $\mu$ is the chemical potential and, to be specific, we consider the case $eV>0$. The above formula assumes that there is no in-plane momentum conservation, which is most likely to be the case of realistic graphene-hBN interfaces. There are several possible mechanisms for elastic scattering at the interface and, in particular, unavoidable fluctuations of the mass term due to the lattice mismatch. Note that elastic tunneling is forbidden between two 2D systems if in-plane momentum is conserved.

If the tunneling conductance per channel is much smaller than the conductivity quantum $e^2/h$ (as in our case) the transmission probability T is exponentially small and depends strongly on the energy E of tunneling electrons, $$T(E)=A(E)\exp[-W(E)] \quad (S3)$$

where A is a smooth function that depends on details of the wave-function matching at the interface. In our modeling, we assume A=const.

Let us now discuss some functional forms of W(E). For the case of an isotropic barrier, we need to solve the dispersion equation $E=\epsilon_n(k_x,k_y,k_z)$ for each band of the barrier material, where E is the energy of electrons tunneling in the z direction. No real solution for $k_z$ is possible inside the energy gap, and the minimal $Imk_z$ $Imk_z$ for a given E and arbitrary $k_x$ and $k_y$, which dominates the tunneling probability, is given by $$W(E)=2d Imk_z$$

For the case of parabolic bands, $$Imk_z=\frac{\sqrt{2m\Delta}}{\hbar}$$

where $\Delta$ is the barrier height (in our case, the distance to the valence band) and m is the effective mass.

In the case of layered crystals, their band structure can be described in the simplest approximation as $$\epsilon(k_x,k_y,k_z)=\tau(k_z)=\epsilon_1(k_x,k_y) \quad (S4)$$

where $\tau(k_z)=2t_\perp \cos(k_z l)$; $t_\perp$ describes the interlayer coupling and l is the interlayer distance (for the case of hBN, $l\approx 3.4$ Å). By solving the corresponding tunneling equation, we find $k_z$ within the gap to be $$k_z=\frac{i}{l}\ln\left(\left|\frac{E-\epsilon_1}{2t_\perp}\right|+\sqrt{\left(\frac{E-\epsilon_1}{2t_\perp}\right)^2-1}\right)$$

The top of the valence band corresponds to $E_{max}=\max \epsilon_1(k_x,k_y)+2t_\perp$ (to be specific, we choose $t_\perp>0$), and the optimal value for the tunneling wavevector is then $$Imk_z=\frac{1}{l}\ln\left(\left(\frac{\Delta}{2t_\perp}+1\right)+\sqrt{\left(\frac{\Delta}{2t_\perp}+1\right)^2-1}\right) \quad (S5)$$

where $\Delta=E-E_{max}$. If $\Delta>>2t_\perp$, this expression can be simplified as $$k_z=\frac{i}{l}\ln\left(\frac{\Delta}{t_\perp}\right)$$

and yields the tunneling probability $T\propto(t_\perp/\Delta)^{2n}$ where n=d/l is the number of atomic layers in the tunnel barrier. In the opposite limit $\Delta>>2t_\perp$, we obtain $$k_z = \frac{i}{l}\sqrt{\frac{\Delta}{t_\perp}} = i\frac{\sqrt{2m*\Delta}}{\hbar}$$

where $$m^* = \frac{\hbar^2}{2t_\perp l^2}$$

is the effective mass in the tunneling direction. This shows that the standard isotropic model is applicable to layered crystals, provided the tunneling occurs not too far from the band-gap edge.

Eq. (S4) is a simplified version of the real band structure of hBN, which depends on stacking order. hBN crystals usually have AA' stacking. In the next approximation that allows an analytical solution by neglecting the mixing of π and σ bands, we obtain the following dispersion relation [S4]

$$\varepsilon^2(k_x, k_y, k_z) = \frac{E_g^2}{4} + \tau^2(k_z) + \varepsilon_1^2(k_x, k_y) \pm 2\tau(k_z)\varepsilon_1(k_x, k_y) \quad (S6)$$

where $E_g$ is the energy difference between boron and nitrogen sites. In this case, we find $$Imk_z = \frac{1}{l}\ln\left(\frac{\Phi}{2t_\perp} + \sqrt{\left(\frac{\Phi}{2t_\perp}\right)^2 - 1}\right) \quad (S7)$$

where $$\Phi = \sqrt{E^2 - \frac{E_g^2}{4}} - |\varepsilon_1(k_x, k_y)|.$$

Eq. (S7) differs from (S5) by replacement $E \rightarrow \sqrt{E^2 - E_g^2/4}$, which indicates the general validity of equation $Imk_z \propto \ln(\Delta)$ for describing vertical tunneling through strongly layered materials. (S5) and (S7) fit our experimental data equally well. It is worth noting that the tunneling exponent through layered crystals depends on E only weakly (logarithmically) in comparison with isotopic crystals that exhibit the standard square-root energy dependence. For small changes in Δ, this difference is unimportant (see below).

Finally, in the case of a strong electric field such that it changes the rectangular shape of the tunnel barrier (FIG. 5D) the above expressions for W can be generalized within the WKB approximation as $$W = 2\int_o^d dx Imk_z(\Delta \rightarrow \Delta(x))$$

Example 4

Layered Versus Isotropic Barrier

In the description above, we have chosen for the sake of brevity to ignore the fact that our tunnel barriers are made from a strongly layered material. This simplification allowed us to refer to the standard tunneling theory. However, the assumption can be justified further by the fact that, for our device parameters, we have found no difference between the I-V characteristics calculated for the layered and isotropic materials and, therefore, we cannot distinguish between the two cases.

To illustrate the indifference to the layered structure of our tunnel barrier, FIG. 11 shows experimental I-V curves for two devices and compares them with the behavior expected for layered and isotropic cases. No major difference can be seen, except at low bias in FIG. 11A. The exact shape of experimental curves at low bias varies from sample to sample (cf. FIGS. 11A & B) and, hence, we do not discuss the difference.

FIG. 11 shows the tunneling I-V characteristics for two different 4-hBN-layer devices according to the invention at zero gate voltage and their comparison with theory. (A) The red solid curve is the experimental data from FIG. 7. The two dashed curves are our modeling for an isotropic barrier (Δ and m as in the main text) and for a layered barrier of the same height and $t_\perp$=0.6 eV, by using formulae from the above section. Note that $t_\perp \approx 0.6$ eV corresponds to m=0.5 $m_0$. (B) Nominally similar device (for clarity, the experimental data are shown by symbols). The curves are again the layered and isotropic versions of the tunneling theory. The fitting parameter is the constant A in eq. (S3), which determines the absolute value of I. The close agreement between functional forms of the theoretical curves validates the use of the conventional tunneling formulae in the main text.

Additional Examples of Our Device Operation

We have studied 6 multiterminal devices such as shown in FIG. 9 and >10 simpler tunneling FETs with only one or two Ohmic contacts attached to each graphene electrode. The latter type does not provide much information about the properties of the graphene electrodes but even one contact is sufficient to study their tunneling I-V characteristics. The devices with the same hBN thickness have exhibited qualitatively similar behavior, as discussed above. To illustrate the degree of reproducibility for different samples, FIG. 12 plots the behavior observed in another device with the tunnel barrier consisting of 4 hBN layers. One can see that the nonlinear I-V characteristics are qualitatively similar to those presented above and their response to gate voltage is also similar.

FIG. 12 shows another hBN-graphene-hBN-graphene-hBN field-effect device according to the invention. (A) Tunneling I-Vs and their response to gate voltage (in 5V steps, cf. FIG. 7 of the main text). The inset compares the experimental I-V at zero gate voltage (red curve) with theory (dark) which takes into account the linear DoS in the two graphene layers and assumes no momentum conservation. Temperature: 300 K. (B) Changes in low-bias tunneling (symbols) and the theory fit for 4 hBN layers (solid curve). The main difference with respect to the device in the main text is a weak response at low gate voltages, which is probably due to stronger disorder and chemical doping that smears the gate influence. The electron-hole asymmetry again implies the hole tunneling as discussed in the main text.

The only consistent difference that we noticed for a number of devices with 4 or more atomic layers of hBN was the absolute value of $\sigma^T$ which could vary by a factor of 100 for nominally the same d. Although this can be attributed to possible errors in determining the number of layers in thicker hBN, more careful analysis of the devices' response to bias and gate voltages reveals that the reason for these variations is more likely to be inhomogeneous thickness of hBN. We believe that in some devices one or two layers can be missing locally (in submicron scale patches) so that the tunnel current then concentrates within these thinner areas. Graphite is known to cleave leaving occasional stripes of smaller thickness for few-layer graphene crystals and, whereas it is possible to see missing graphene patches in an optical microscope, hBN does not allow the required resolution.

Vertical Transistors Using Few-Layer $MoS_2$ as a Barrier

One of the possible routes to increase the ON-OFF ratio is to use materials with smaller $\Delta$. In this way it would be viable to use thicker barriers but shift $E_F$ closer to the barrier edge, which should allow exponential dependence of the tunnel current on gate voltage. One of the candidate materials is $MoS_2$. It is a layered semiconductor, which can be cleaved down to a monolayer. It has an indirect band gap of $\approx 1.3$ eV which is significantly lower than that in hBN. We have exploited $MoS_2$ to prepare various graphene-$MoS_2$ devices by using the same procedures as described above.

Figure 13A:
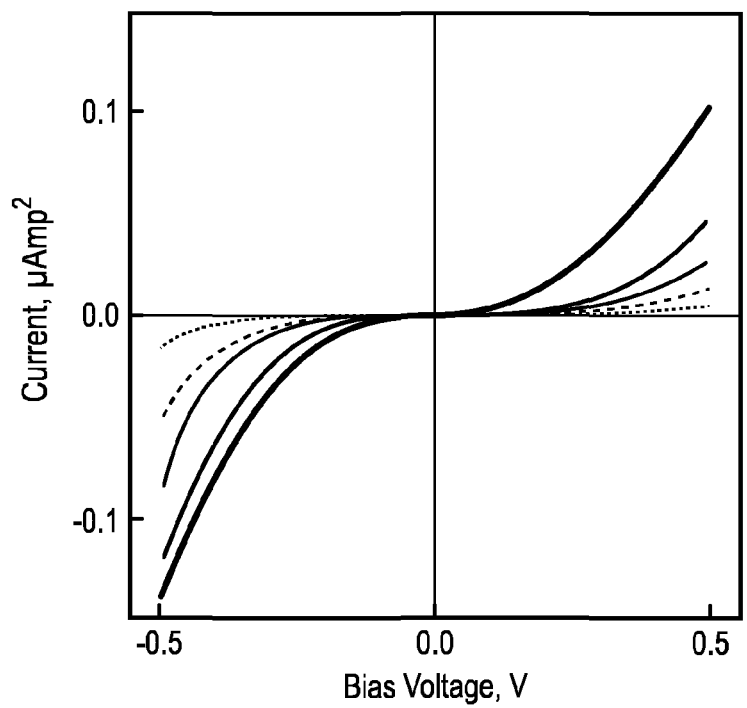
Figure 13B:
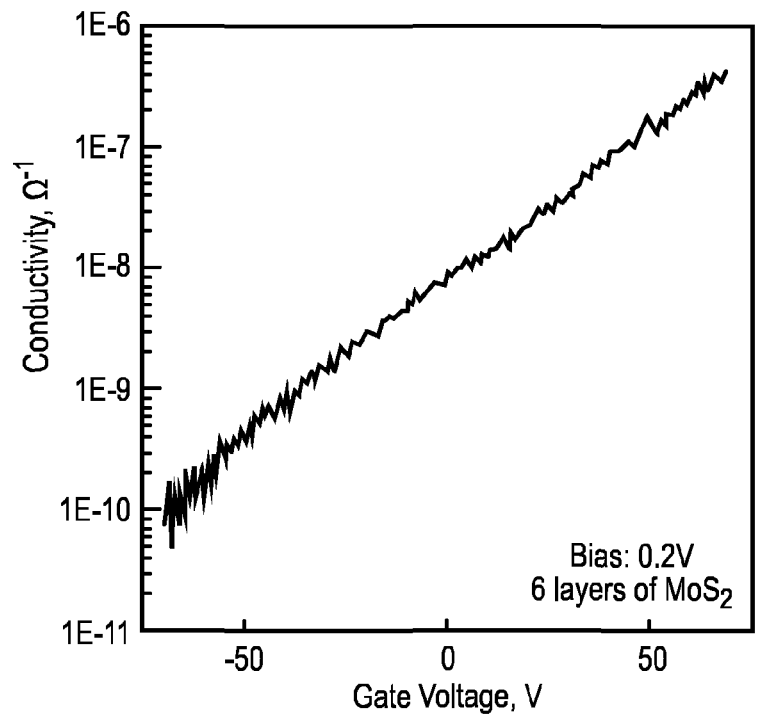

I-V characteristics for a transistor with a 6-layer $MoS_2$ barrier are presented in FIG. 13A. Measurements of its conductivity at a fixed small bias as a function of gate voltage are plotted in FIG. 13B. The dependence is clearly exponential and in this device an ON-OFF ratio of ~10,000 has been achieved. Further work is needed to improve the observed ratios further and to verify whether the mechanism responsible for vertical transport through $MoS_2$ is indeed tunneling.

FIG. 13 shows the I-V characteristics of a graphene $MoS_2$ device according to the invention. Thickness of $MoS_2$ is 6 layers. (A)—Different curves correspond to various gate voltages applied. Black: −40V; red: −20V; blue: 0V; purple: +20; green: +40V. (B)—Conductivity measured at a bias voltage of 0.2V as a function of gate voltage. The ON/OFF ratio of $>7 \times 10^3$ is observed even for the relatively limited range of gate voltages.

We conclude that our tunneling devices offer a viable route for high speed graphene-based analogue electronics. The ON-OFF ratios already exceed those demonstrated for planar graphene FETs at room temperature by a factor of 10 (see for example F. Schweirz, Graphene transistors. *Nature Nano* 5, 487-497 (2010). The transit time for the tunneling electrons through the nm-thick barriers is expected to be extremely fast (a few fs) and exceeds the electron transit time in submicron planar FETs. It should also be possible to decrease the lateral size of the tunneling FETs down to the 10 nm scale, a requirement for integrated circuits.

Furthermore, there appears to be no fundamental limitation to significantly enhance the ON-OFF ratios by optimizing the architecture and by using higher-quality gate dielectrics and, in particular, lower tunnel barriers ($\Delta$<maximum achievable $E_F$). The use of other semiconductors (such as thin layers of dichalcogenides) can provide a tunneling regime in which the current is exponentially sensitive to $V_g$. We believe that the electronic properties of the demonstrated devices merit further research to explore their limitations and scope, and their potential for applications.

When used in this specification and claims, the terms "comprises" and "comprising" and variations thereof mean that the specified features, steps or integers are included. The terms are not to be interpreted to exclude the presence of other features, steps or integers.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure, without departing from the broad concepts disclosed. It is therefore intended that the scope of the patent granted hereon be limited only by the appended claims, as interpreted with reference to the description and drawings, and not by limitation of the embodiments described herein.

The invention claimed is:

1. A graphene heterostructure having:
 a first graphene layer, shaped to form a first structure comprising at least one contact region;
 a second graphene layer, shaped to form a second structure comprising at least one contact region; and
 a spacer positioned between the first graphene layer and the second graphene layer, wherein the spacer has a thickness in the range 3 to 8 layers of one or more materials;
 wherein the graphene heterostructure includes two or more contacts, including a source contact and a drain contact; and
 wherein the source contact is positioned on at least one of the contact regions of the first structure; and
 wherein the drain contact is positioned on at least one of the contact regions of the second structure.

2. The graphene heterostructure according to claim 1, wherein the spacer includes hexagonal boron-nitride.

3. The graphene heterostructure according to claim 1, wherein the spacer lies directly next to the first graphene layer, and the second graphene layer lies directly next to the spacer.

4. The graphene heterostructure according to claim 1, wherein the spacer has a thickness of 10 nm or less.

5. The graphene heterostructure according to claim 4, wherein the spacer has a thickness in the range 2 nm to 4 nm.

6. The graphene heterostructure according to claim 1, wherein the first graphene layer is a single sheet of graphene, and the second graphene layer is a single sheet of graphene.

7. The graphene heterostructure according to claim 1, wherein the graphene heterostructure includes a base layer on which the first graphene layer is positioned.

8. The graphene heterostructure according to claim 7, wherein the base layer includes hexagonal boron-nitride.

9. The graphene heterostructure according to claim 7, wherein the graphene heterostructure includes a substrate on which the base layer is positioned.

10. A transistor comprising:
 a source electrode;
 a drain electrode; and
 an insulating barrier in contact with and situated between both the source electrode and the drain electrode, the insulating barrier comprising from 3 to 8 layers of one or more materials;
 wherein at least one of the source electrode and the drain electrode comprises a layer of graphene and the other electrode comprises a layer of a conductive material.

11. The graphene heterostructure according to claim 1, wherein the graphene heterostructure is comprised in a transistor.

12. The transistor of claim 10, wherein the transistor is a quantum tunnelling transistor.

13. A transistor comprising:
 a source electrode;
 a drain electrode; and
 an insulating barrier in contact with and situated between both the source electrode and the drain electrode;

wherein the thickness of the insulating barrier layer is selected to provide a quantum tunnelling electron transport between the source electrode and the drain electrode; and wherein at least one of the source electrode and the drain electrode comprises a layer of graphene and the other electrode comprises a layer of a conductive material.

14. A graphene heterostructure having:

a first graphene layer, shaped to form a first structure comprising at least one contact region;

a second graphene layer, shaped to form a second structure comprising at least one contact region; and a spacer positioned between the first graphene layer and the second graphene layer, wherein the spacer has a thickness in the range 1 to 30 layers of one or more materials;

wherein the graphene heterostructure includes two or more contacts, including a source contact and a drain contact; and wherein the source contact is positioned on at least one of the contact regions of the first structure; and wherein the drain contact is positioned on at least one of the contact regions of the second structure.

\* \* \* \* \*